United States Patent [19]
Tanaka et al.

[11] Patent Number: 5,910,924
[45] Date of Patent: Jun. 8, 1999

[54] SEMICONDUCTOR INTEGRATED CIRCUIT INCLUDING VOLTAGE CONVERTER EFFECTIVE AT LOW OPERATIONAL VOLTAGES

[75] Inventors: Hitoshi Tanaka, Ome; Masakazu Aoki, Tokorozawa; Kiyoo Itoh, Higashi-kurume, all of Japan

[73] Assignees: Hitachi, Ltd.; Hitachi ULSI Engineering Corp., both of Tokyo, Japan

[21] Appl. No.: 08/917,706

[22] Filed: Aug. 26, 1997

[30] Foreign Application Priority Data

Aug. 27, 1996 [JP] Japan .................................... 8-224789

[51] Int. Cl.⁶ .................................................. G11C 7/00
[52] U.S. Cl. .......................... 365/226; 365/227; 327/541; 327/543
[58] Field of Search ..................... 365/226, 227, 365/228, 229; 327/540, 541, 543, 77

[56] References Cited

U.S. PATENT DOCUMENTS

| | | | |
|---|---|---|---|
| 5,132,555 | 7/1992 | Takahashi | 327/540 |
| 5,162,668 | 11/1992 | Chen et al. | 327/541 |
| 5,321,653 | 6/1994 | Suh et al. | 365/226 |
| 5,349,559 | 9/1994 | Park et al. | 365/226 |
| 5,463,588 | 10/1995 | Chonan | 365/226 |
| 5,519,656 | 5/1996 | Maccarrone et al. | 327/540 |
| 5,592,421 | 1/1997 | Kaneko et al. | 365/226 |
| 5,592,423 | 1/1997 | Tokami | 365/226 |
| 5,612,920 | 3/1997 | Tomishima | 365/226 |
| 5,706,240 | 1/1998 | Fiocchi et al. | 327/540 |

*Primary Examiner*—David Nelms
*Assistant Examiner*—Tuan T. Nguyen
*Attorney, Agent, or Firm*—Fay, Sharpe, Beall, Fagan, Minnich & McKee

[57] ABSTRACT

A push-pull type output circuit is used in the differential amplifier of a voltage converter circuit. The threshold voltage of the driving transistor is set lower than the voltages of the transistors of the other circuits to operate the differential amplifier at a voltage higher than the power supply voltage. By using the push-pull type output circuit, the amplitude increases and it is possible to raise the capacity of the driving transistor. Moreover, by setting the threshold voltage of the driving transistor of the buffering circuit lower than the threshold voltages of the transistors of the other circuits, it is possible to further raise the driving capacity. Increase of the sub-threshold current due to lowering of the threshold voltage can be prevented by operating the differential amplifier at a voltage higher than the power supply voltage.

23 Claims, 12 Drawing Sheets

SEMICONDUCTOR INTEGRATED CIRCUIT INCLUDING VOLTAGE CONVERTER EFFECTIVE AT LOW OPERATIONAL VOLTAGES

BACKGROUND OF THE INVENTION

1. Field of the Invention

The present invention relates generally to a voltage converter circuit (or voltage limiter) built in a semiconductor chip, and more particularly to a voltage converter circuit that is effective at low power supply voltages, including those near the internal chip voltage.

2. Description of the Related Art

In general, in the case of a semiconductor integrated circuit constituting a memory or microprocessor, the number of elements increases as the integration degree of the semiconductor integrated circuit is raised. However, current consumption increases because higher operation speed is required. Moreover, elements in the semiconductor integrated circuit are miniaturized and their breakdown voltage is lowered. Therefore, it is necessary to lower the power supply voltage as the integration degree is raised.

The power supply voltage is stipulated to a value such as 5, 3.3, or 2.5 V by the JEDEC (Joint Electronic Device Engineering Council—Electronic Industrial Association), and the power supply voltage of each semiconductor integrated circuit is standardized thereby. It is desirable to keep the external power supply voltage at a conventional value for the effective use of conventional design know-how and to efficiently interface with small- and middle-scale devices.

In consideration of the difference, due to miniaturization and decrease of the breakdown voltage of this type of circuit device, between the characteristics of a semiconductor integrated circuit and external characteristics such as the external power supply voltage, an on-chip voltage converter circuit has been studied. The on-chip voltage converter circuit serves as a power supply circuit for supplying a voltage to an internal circuit on the chip that is lower than the external voltage received by the voltage converter circuit, particularly for a large capacity metal-oxide semiconductor field-effect transistor (MOSFET, or MOS) integrated circuit such as a 16 Mbit dynamic random access memory (DRAM).

An example of a conventional voltage converter circuit is a feedback-control-type voltage converter circuit, which comprises a p-channel MOSFET serving as a control transistor for controlling the output or a driving transistor whose source is connected to the power supply terminal and whose drain is connected to the output terminal, and a MOS differential amplifier that has a signal stage and serves as an error amplifier for comparing the output voltage from the driving transistor with a reference voltage. The differential amplifier controls the driving transistor in accordance with the comparison output. The voltage converter circuit is illustrated in FIG. 4.29 on p. 271 of *VLSI Memory*, published by BAIFUKAN (transliterated) in November, 1994, and also described in the *IEEE Journal of Solid State Circuits*, Vol. 23, No. 5, (October. 1988), pp. 1128–1132.

SUMMARY OF THE INVENTION

FIG. 3 illustrates a set of operation waveforms that can be obtained using the voltage converter circuit of FIG. 2.

The voltage converter circuit having the above structure produces an output from the drain of its driving transistor by connecting the source of the driving transistor to the power supply terminal. Therefore, even if the voltage between the source and the drain is relatively lowered, it is possible to apply a control signal at a relatively high level between the source and the drain, whereby a suitable operation can be expected at a relatively low power supply voltage.

Moreover, it is possible to relatively simplify the signal phase rotation in the feedback loop of the voltage converter circuit. Therefore, the voltage converter circuit stably operates without requiring compensation, which cannot be easily constituted as a semiconductor integrated circuit, for preventing abnormalities such as ringing or oscillation of the circuit. Thus, the circuit is considered to be preferable as an on-chip circuit constituted as a semiconductor integrated circuit, together with an internal circuit to which the output voltage of the voltage converter circuit is supplied.

As described above, when miniaturizing a device, it is necessary to lower the power supply voltage and the threshold voltage VT of the MOS transistors. However, to lower the power supply voltage and the threshold voltage of the MOS transistors, it has been found that the following new problems must be solved.

(1) When the threshold voltage VT is lowered, the sub-threshold current, or sub-threshold leakage current (described on p. 351 of *VLSI Memory*), increases. To decrease the undesired current consumption in the circuit due to the sub-threshold current, it is impossible to simply lower the threshold voltage at a ratio corresponding to the reduction ratio of the power supply voltage one-to-one. Thus, the threshold voltage of the MOSFET becomes a relatively large value.

(2) Moreover, even if the thickness of the gate insulator or the channel length of the MOS transistor is decreased, the driving capacity of the MOS transistor does not increase due to carrier velocity saturation, unlike the simple theoretical expectation. Therefore, to adequately drive the MOS transistors that constitute the internal circuit, considering the operating speed characteristics to be obtained, it is inevitable to relatively raise the internal voltage VL supplied to the internal circuit instead of lowering the voltage VL proportionally to the lowering of the power supply voltage supplied from the outside. Therefore, the difference between the power supply voltage VDD to be supplied and the converted voltage VL to be obtained decreases as the device is miniaturized. For example, though the products of first-generation 16 Mbit DRAMs fabricated by a semiconductor integrated circuit fabrication process (0.5 mm process) of a minimum processing dimension of 0.5 mm have a VDD of 5 V and a VL of 3.3 V, the first-generation 256 Mbit DRAMs fabricated by a 0.2-mm process have a VDD of 3.3 V and a VL of 2.5 V. Moreover, the second-generation 16 Mbit/256 Mbit DRAMs have a VDD of 3.3 V/2.5 V and a VL of 2.5 V/2.0 V. Therefore, the difference between VDD and VL is further decreased.

The driving capacity of the first generation will be compared below. For a differential amplifier comprising differential MOSFETs and a current-mirror-type load circuit for receiving one of the drain outputs of the differential amplifier MOSFETs and generating a current to be supplied to the drain of the other MOSFET, the threshold voltage of the differential amplifier MOSFETs is represented by VT, the drain conductance of the differential amplifier MOSFETs by b, and the operating current of a MOSFET by Is. A voltage Vgs applied across the gate and the source of the driving transistor is given by $Vgs = VDD - \{VL - (VT + (2Is/b)^{1/2})\}$. Therefore, as the result of computing the Vgs, Vgs=3.33 V is obtained for the former (16 Mbit DRAM, VDD=5 V, VL=3.3 V) when assuming |VT|=1 V, Is=2 mA, and b=10 mS/V, and Vgs=2.43 V is obtained for the latter (256 Mbit DRAM, VDD=3.3 V, VL=2.5 V) when assuming that the VT, Is, and b are the same, and the effective gate voltage, from which the value equivalent to the VT is subtracted, is reduced 60% or more. However, because the increase of the transistor driving capacity due to miniaturization is 60% or less, the driving capacity of the voltage converter circuit is relatively decreased.

(3) Furthermore, in accordance with the improvement of integration degree due to advancements in semiconductor integrated circuit technology, the number of elements in an internal circuit increases, the current consumption increases, and the driving capacity is further insufficient.

The above problems may become more serious when the difference between VDD and VL is approximately 1 V or less for existing transistors.

Therefore, to increase the driving capacity, the channel width of the driving transistor in the voltage converter circuit is increased. Thereby, a capacitance comprising the gate electrode capacitance of the driving transistor increases and the load capacity viewed from the output terminal of the differential amplifier increases. Accordingly, the delay time in the feedback route in the voltage converter circuit increases, the operation of the voltage converter circuit becomes unstable, and ringing or oscillation may occur.

To prevent these troubles, if the current of the differential amplifier is increased, the total current consumption of the semiconductor chip increases, the gain of the differential amplifier decreases, and no accurate output voltage can be obtained. Furthermore, the driving capacity can be increased by lowering the threshold voltage of the driving transistor. In this case, however, it is necessary to pay attention to the consequent increase of the sub-threshold current of the driving transistor. That is, when the load current decreases, the leakage current flowing through the driving transistor from the VDD exceeds the lowered load current level and the output voltage may be higher than the reference voltage.

Moreover, it is possible to study the supply of the output of the differential amplifier (serving as an error amplifier) to the driving transistor through a CMOS inverter circuit, considering that the CMOS inverter circuit has the well-known property of outputting a signal with a large amplitude in an approximate operating power supply range, even for an input signal with a relatively small amplitude. However, the circuit to whose structure the CMOS inverter circuit is added must substantially include an amplifier having a three-stage structure constituted by a differential amplifier, an amplifier comprising a CMOS inverter circuit, and an amplifier comprising a driving transistor and its load in the feedback loop of the voltage converter circuit. Therefore, care must be taken to control the phase. That is, it is very difficult to stabilize the operation and it is difficult to constitute the circuit as an on-chip circuit. The stability of the circuit operation becomes a particularly major problem because, when the operating current of the internal circuit to which the output voltage is supplied greatly changes with the operation state of the internal circuit like a DRAM, the signal phase rotation value between the input and output of the driving transistor greatly changes.

As described above, in the case of a conventional voltage converter circuit, the driving capacity becomes insufficient as the power supply voltage of the chip is lowered and the capacity is increased. To provide compensation to the driving capacity, however, a problem arises in that the voltage converter circuit becomes unstable and no accurate voltage can be obtained.

Therefore, it is an object of the present invention to provide a voltage converter circuit having a relatively high driving capacity, even at a low power supply voltage, and high operation stability, and to provide a semiconductor circuit using such a voltage converter circuit.

It is another object of the present invention to provide a voltage converter circuit that is suitable for a low voltage, large capacity semiconductor integrated circuit, and a semiconductor integrated circuit using such a voltage converter circuit.

It is still another object of the present invention to provide a voltage converter circuit that is capable of operating at a low voltage and that is suitable to be constituted as a semiconductor integrated circuit together with an internal circuit.

Another object of the present invention is to provide a voltage converter circuit that consumes less power, and a semiconductor integrated circuit using such a voltage converter circuit.

It is still another object of the present invention to provide a voltage converter circuit that is preferable to standby control, and a semiconductor integrated circuit using such voltage converter circuit.

Another object of the present invention is to provide a voltage converter circuit that is suitable for a MOS semiconductor integrated circuit constituting a memory.

Typical means of the present invention for solving the above problems use an output section of a differential amplifier, having a current-mirror-type output circuit structure. More preferable means of the present invention use a current-mirror-type output circuit having a push-pull output structure.

Further means of the present invention use a driving transistor whose threshold voltage is lower than the threshold voltage of the transistor of the internal circuit, and a differential amplifier to be operated with a supply voltage that is higher than the power supply voltage to be supplied to the driving transistor.

More preferable means of the present invention can be obtained by combining the above means.

Other objects and features of the present invention will become apparent from the following description and the accompanying drawings.

DETAILED DESCRIPTION OF THE PREFERRED EMBODIMENTS

[Embodiment 1]

Figure 1:
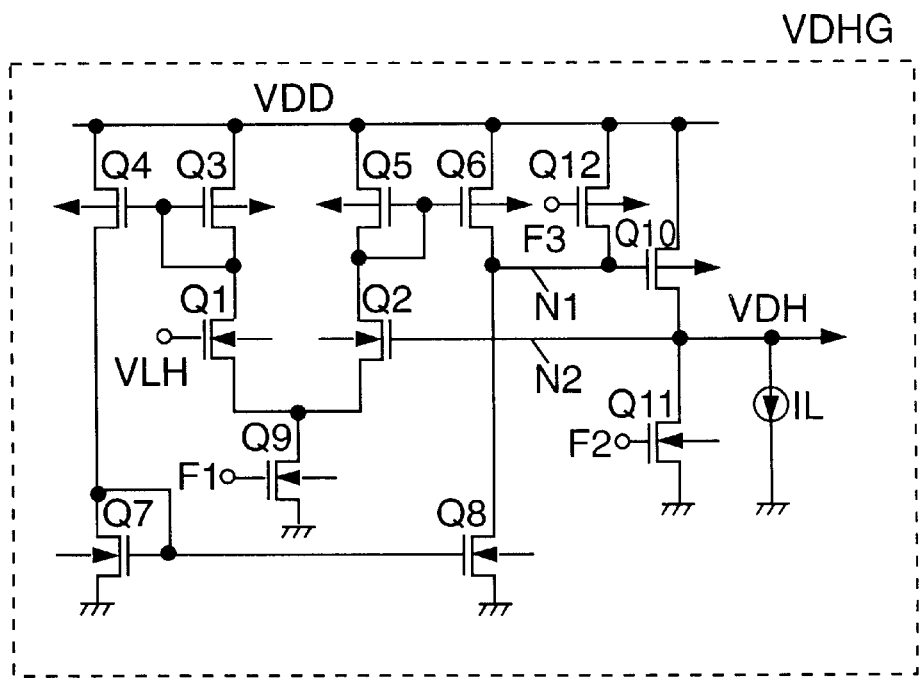
FIG. 1 shows a voltage converter circuit according to a first embodiment of the present invention.
Figure 2:
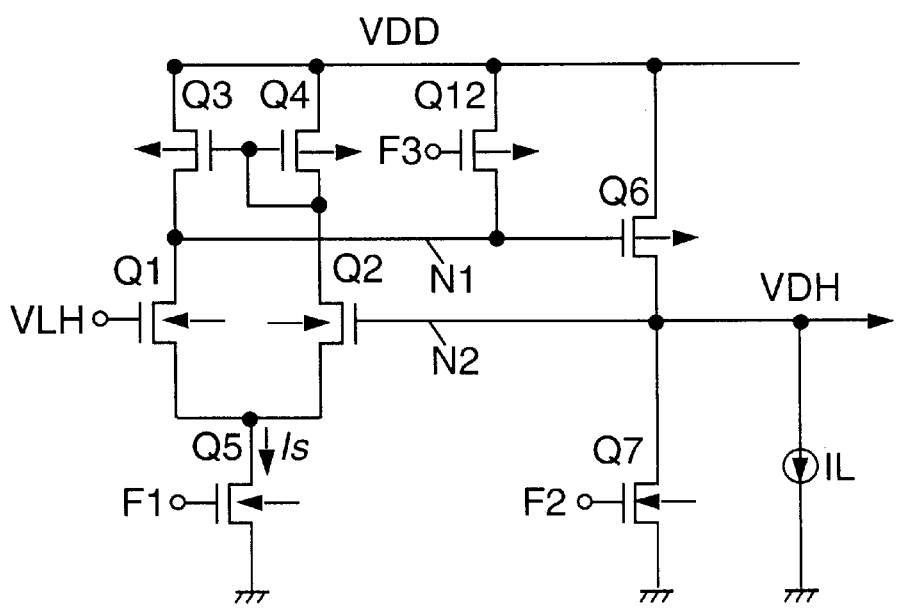
FIG. 2 shows a voltage converter circuit studied prior to the present invention.
Figure 3:
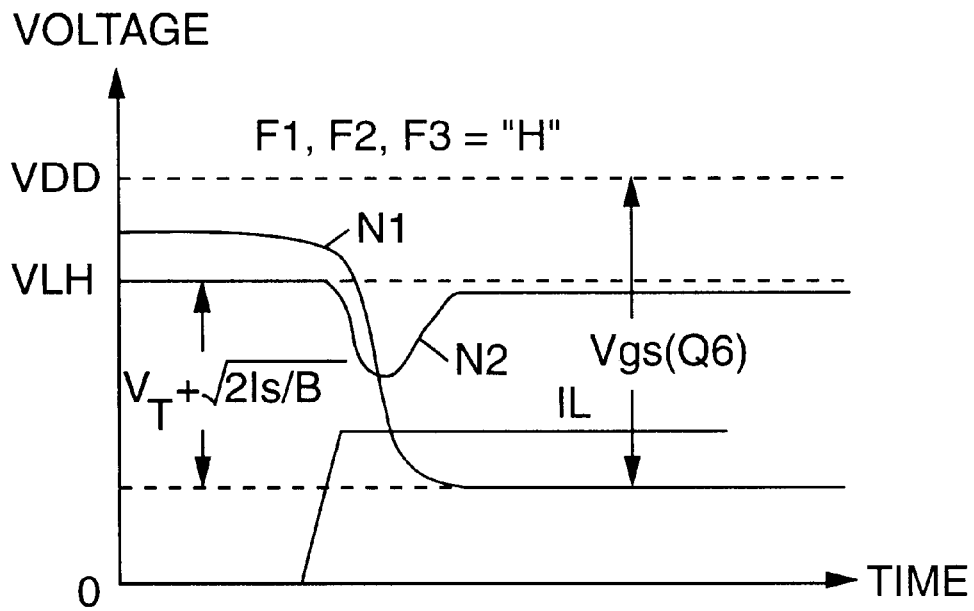
FIG. 3 shows operating waveforms for the voltage converter circuit of FIG. 2.

FIG. 1 is a circuit diagram of a voltage converter circuit constructed according to a first embodiment of the present invention. The illustrated circuit comprises an error amplifier constituted by a differential amplifier that supplies an error amplification output (indicating ΔV>0 at the noninverting and inverting inputs) to a node N1, and a buffering circuit (or driver) for receiving the output and supplying an output voltage VDH to a node N2.

In the case of this embodiment, the differential amplifier, though not so restricted, comprises a differential input stage and a push-pull-type output circuit having a current mirror circuit structure.

That is, the differential amplifier, as illustrated, comprises a differential input stage including differential n-channel MOSFETs Q1 and Q2, a current source transistor Q9 for supplying an operating current to the common source of the transistors Q1 and Q2, p-channel load MOSFETs Q3 and Q5 diode-connected by connecting gate to drain, and an output circuit including a p-channel MOSFET Q4 constituting a first current mirror circuit together with the load transistor Q3, a p-channel MOSFET Q6 constituting a second current mirror circuit together with the load transistor Q5, and n-channel MOSFETs Q7 and Q8 constituting a third current mirror circuit receiving the output of the first current mirror circuit as an input.

The gate of the differential transistor Q1 is regarded as a noninverting input node of the differential amplifier, to which a reference voltage VLH is supplied from a not-illustrated reference voltage generation circuit. The reference voltage generation circuit can be a simple resistance-division-type circuit, a band-gap reference circuit using a parasitic bipolar transistor, or a ΔVT-type circuit using the threshold voltage difference of a MOS transistor. The gate of the differential transistor Q2 is regarded as an inverting input node of the differential amplifier, to which the output VDH of the buffering circuit is returned through the node N2. A bias voltage F1 is supplied to the gate of the current-source transistor Q9 from a not-illustrated bias circuit.

The buffering circuit is provided with a p-channel driving MOSFET Q10, an operation control transistor Q12, and an n-channel control MOSFET Q11.

As illustrated, the source electrode of the driving transistor Q10 is connected to a power supply terminal VDD, the gate electrode is connected to the node N1 (that is, the output of the differential amplifier), and the drain electrode is connected to the node N2. A transistor like the driving transistor Q10 can be regarded as a control device whose drain electrode is an output electrode, whose gate electrode is a control electrode, whose source electrode is a reference electrode serving as a reference potential point for a control signal to be fed to the gate electrode, and whose current between the output electrode and the reference electrode is controlled by a control signal fed between the control electrode and the reference electrode.

According to the illustrated connection, since the reference electrode of the driving transistor Q10 is connected to the power supply terminal VDD, even if the potential difference between the reference electrode and the output electrode relatively decreases, it is possible to feed a control signal at a relatively high level between the reference electrode and the control electrode. Therefore, the driving transistor Q10 can be so controlled as to supply a relatively large current to the output node N2 even when the potential difference between the power supply terminal VDD and the output node N2 is relatively small. Thereby, the buffering circuit can be operated as a low-voltage loss circuit.

The output VDH of the buffering circuit is supplied to a load comprising a not-illustrated internal circuit. In FIG. 1, the load is shown as IL for convenience.

Operations and functions of the control transistors Q11 and Q12 in the buffering circuit will be described later.

For the differential amplifier having the illustrated structure, the gate voltage of the driving transistor Q10 can be lowered up to approximately the ground potential (or standard potential for a circuit) VSS (0 V) of the circuit. Therefore, it is possible to raise the voltage between the gate and the source of Q10 and, resultantly, raise the driving capacity of the buffering circuit.

Figure 4:
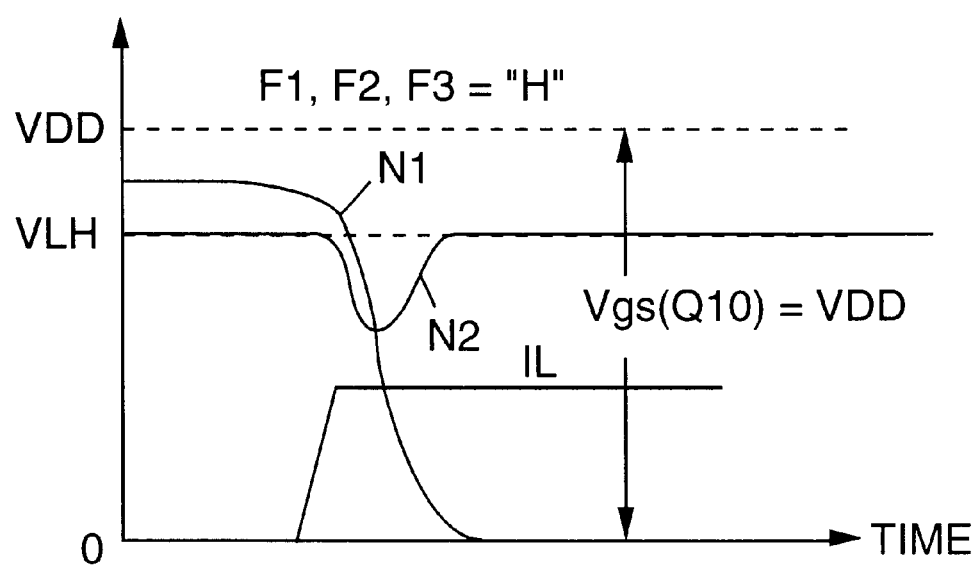
FIG. 4 shows operating waveforms of the first embodiment.

FIG. 4 shows operating waveforms of the circuit of FIG. 1. When the voltage of the output node N2 lowers correspondingly to the load current IL, the differential amplifier detects this change and decreases the current of Q2 while simultaneously increasing the current of Q1. This change is transmitted to the output node N1 through the first current mirror circuits Q3 and Q4 and the third current mirror circuits Q7 and Q8. The current change of Q2 is transmitted to the output node N1 through the second current mirror circuits Q5 and Q6. Thus, the current of the output transistor Q6 of the second current mirror circuit decreases and the current of the output transistor Q8 of the third current mirror circuit increases. That is, the push-pull operation is performed by the output transistors Q6 and Q8. In this case, the source voltages of the transistors Q6 and Q8 are VDD and VSS, respectively, and the operation modes of the transistors Q6 and Q8 are source terminated operation (or common-source amplifier) modes. Therefore, when the current changes of Q1 and Q2 are equal to or higher than a certain level, the output node N1 fully swings approximately between VDD and VSS.

In order to fully swing the output node N1 only, it is possible to use a circuit with a small number of circuit elements and a relatively simple structure, such as a CMOS inverter circuit, as the output circuit of the differential amplifier. In this case, however, the distance between the pole of the inverter circuit (produced by the output resistance of the inverter and the gate capacitance of Q10) and the pole of the differential amplifier (produced by the output resistance of the differential amplifier and the input capacitance of the inverter) decreases, and the phase margin is decreased to almost zero including the pole of the buffering stage (produced by the output resistance of the buffering circuit and the capacitance of the load circuit).

In the case of the circuit of this type, the operation stability is deteriorated and, in the worst case, the circuit does not function as a circuit at all due to abnormal operations such as oscillation. That is, because the circuit of this type has little phase margin, it frequently causes abnormalities such as ringing or oscillating due to small fluctuations of the operating condition or operating characteristics of the MOS transistor caused by the change of the input power supply voltage or the operating temperature. Moreover, the circuit of this type can stably operate only in a very narrow load current range due to the similar change of the operating condition of the MOS transistor caused by the change of the load current. Therefore, the circuit cannot be applied to a load having a normal operation mode in which the circuit is operated by a relatively large operating current, and a standby mode in which the circuit is operated by a relatively small operating current, that is, a load having a large load current change.

In the case of this embodiment, however, because the load transistor (Q3 or Q5) at the differential input stage is a diode-connected transistor and its operating resistance decreases, even though a current mirror circuit is connected between the differential input stage and the buffering circuit, the pole produced by this operating resistance and the gate capacitance of the current mirror circuit is located at a position higher enough than two other poles (a pole determined by the output resistance of the current mirror and the gate capacitance of the buffering circuit, and a pole determined by the output resistance of the buffering circuit and the capacitance of the load circuit). Therefore, in this embodiment, a circuit with essentially unimpaired stability can be obtained.

As described above, this embodiment makes it possible to obtain a high driving capacity because the voltage between the gate and the source of the driving transistor of the buffering circuit is increased while keeping the stability of the voltage converter circuit even at a low power supply voltage.

The above first embodiment, though not restricted, has a structure for adapting the circuit operation more preferably to the fluctuation of the load current IL, and for stopping the circuit operation as described below.

That is, the control transistor Q11 of the buffering circuit constitutes a kind of idling current source capable of supplying an adequate current to the driving transistor Q10, even if the load current IL drops drastically. The driving transistor Q10 of the buffering circuit is brought into an operating state having an appropriate gain irrespective of a large change of the load current IL by the idling current produced by the control transistor Q11. This limitation of gain change is important for maintaining the stable operating range of this embodiment, which range tends to be limited by including amplifiers of substantially three stages in the circuit loop.

Moreover, the control transistor Q12 of the buffering circuit is used to preferably cut off the driving transistor Q10 synchronously with the stoppage of operation of the voltage converter circuit, by switch-controlling the bias voltage F1 applied to the current source transistor Q9 to 0 V.

That is, when the internal circuit is put into an operating state, such as a standby state, in which the load current IL is decreased to a very low level, control signals F1 and F3 are respectively changed from high level to low level, in sync with the change of the load current IL to the very low level. In accordance with the change of the control signal F1 to low level, the current source transistor Q9 is turned off, and thereby the operation of the differential amplifier is stopped. Moreover, in accordance with the change of the control signal F3 to low level, the control transistor Q12 is turned on and the driving transistor Q10 is cutoff-driven by the control transistor Q12. In accordance with the cutoff-driving of the driving transistor Q10, the leak current of the driving transistor Q10 is reduced and the output voltage VDH is prevented from abnormally rising. That is, an abnormal voltage is prevented from being applied to the load, such as the internal circuit at standby.

[Embodiment 2]

In the first embodiment, the differential amplifier is an n-MOS-input-type transistor, and the driving transistor of the buffering circuit is a current-discharge type using a p-MOS. The circuit of this type is suited to output a voltage between VDD/2 and approximately VDD because the voltage between the gate and the source of the input transistor Q1 or Q2 of the differential amplifier can be high. However, a current-absorbing-type driving circuit with a voltage between VSS and approximately VDD/2 may be required depending on the application. Under these conditions, the voltage between the gate and the source of the input transistor Q1 or Q2 is extremely reduced, or, in the worst case, the input transistor is cut off and normal amplifying operation cannot be performed. Therefore, this second embodiment is designed to output a voltage between VSS and approximately VDD/2, and to absorb a large current.

Figure 5:
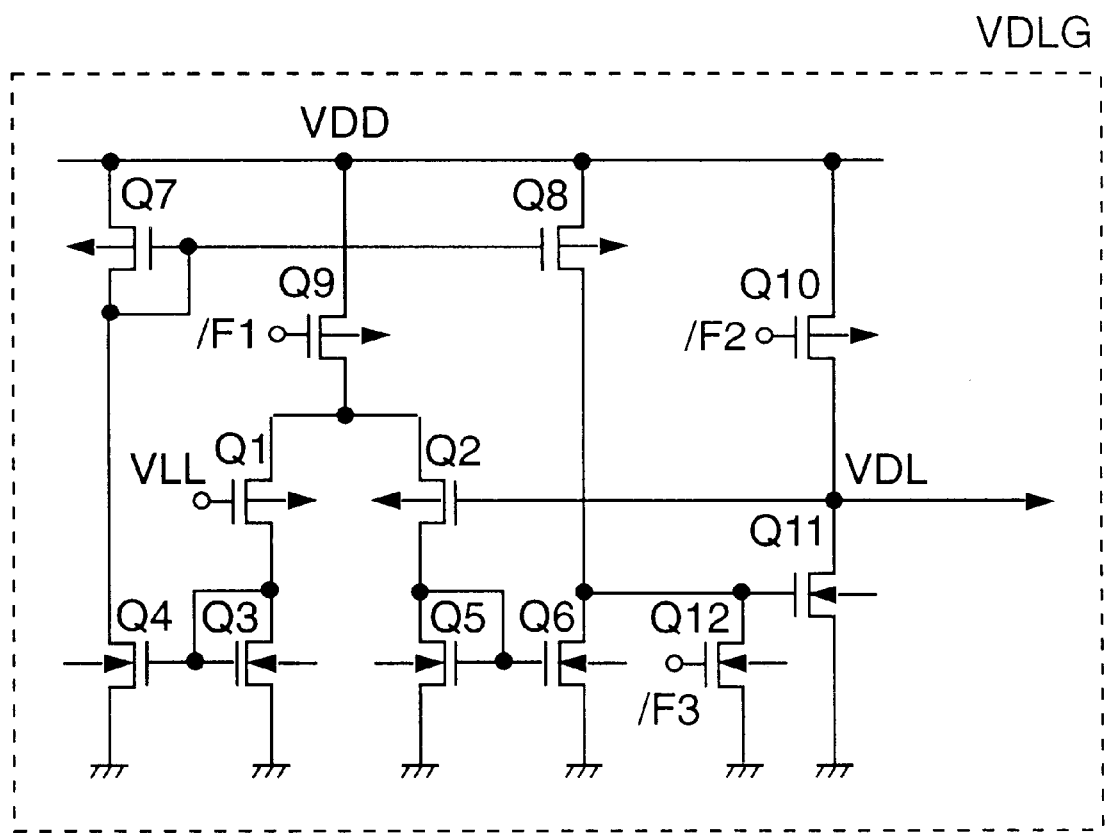
FIG. 5 shows a voltage converter circuit according to a second embodiment of the present invention.

FIG. 5 is a circuit diagram of the voltage converter circuit of the second embodiment of the present invention. This embodiment is constituted by reversing the polarities of all transistors used in the first embodiment, and by reversing the power supply voltage of the first embodiment. That is, p-MOS-input-type transistors are used for the differential amplifier, and an n-MOS transistor is used for the driving transistor of the buffering circuit. By this design, a voltage between VSS and approximately VDD/2 is preferably output, and a relatively large current can be absorbed.

That is, by using p-MOS transistors for the input stage of the differential amplifier, a sufficiently high voltage is applied between the gates and sources of the input transistors Q1 and Q2 even if the input voltages VLL and VDL are lowered. Moreover, by using an n-MOS for the driving transistor Q11 and setting the source of the n-MOS to the circuit ground potential VSS to thereby operate in the source terminated operation mode, a large driving force can be obtained.

[Embodiment 3]

Figure 6:
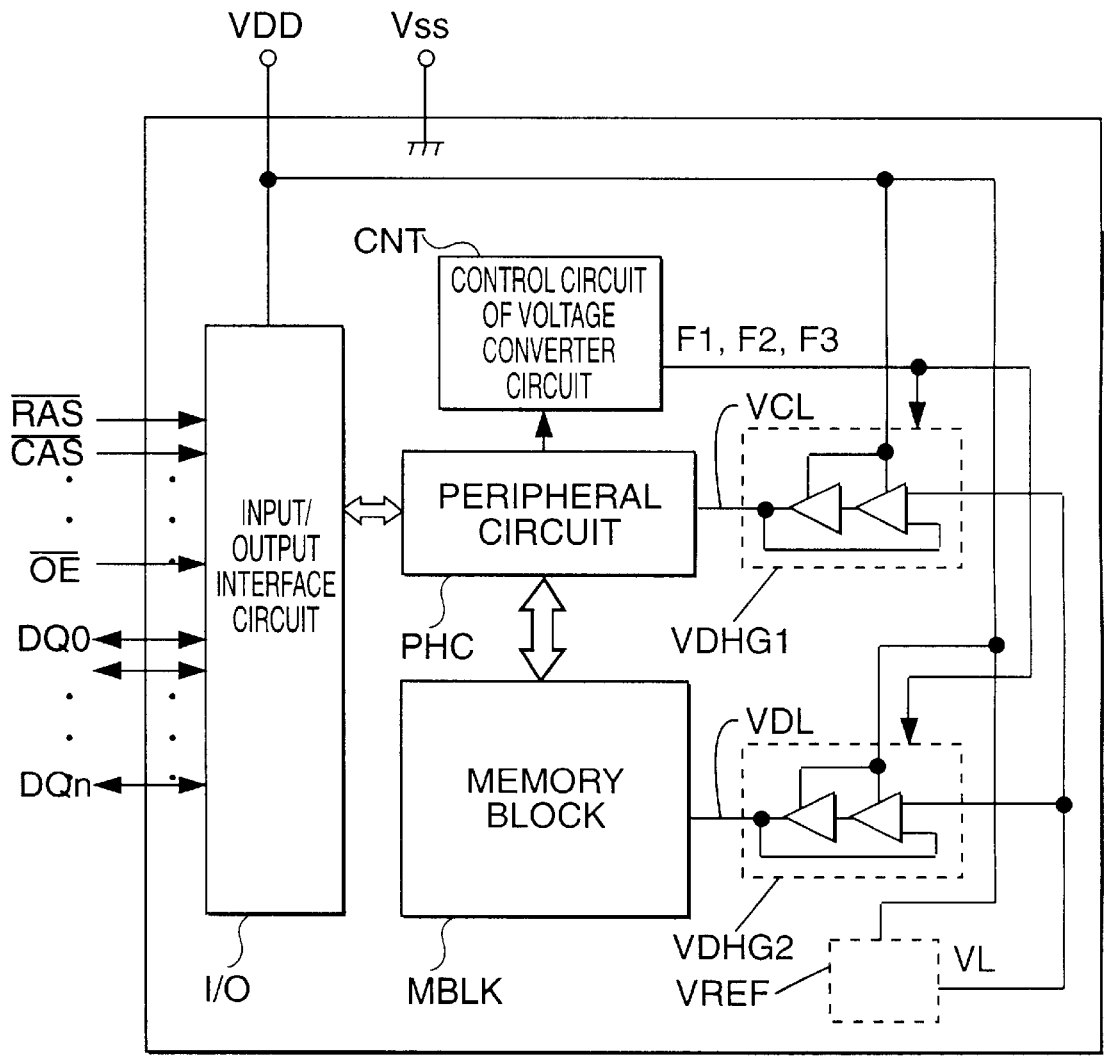
FIG. 6 shows the internal structure of a memory chip of a third embodiment to which the first embodiment is applied.

FIG. 6 shows a block diagram of a DRAM (dynamic random access memory) according to a third embodiment of the present invention.

The illustrated DRAM is formed on a semiconductor chip made of single-crystal silicon by a generally-known CMOS semiconductor integrated circuit manufacturing technique.

In the case of the DRAM of this embodiment, the circuit element structure is miniaturized by a miniaturization technique such as submicron CMOS semiconductor integrated circuit fabrication. Its internal circuit is designed to operate at a lower power supply voltage. Therefore, the circuit structure is obtained by incorporating a control circuit CNT, voltage converter circuits VDHG1 and VDHG2, and reference voltage generation circuit VREF into a generally-known DRAM.

The generally-known DRAM portion will be outlined below. However, the illustration of detailed circuits is omitted because their drawings are complicated although well-known, and the understanding of the DRAM of this embodiment is made more difficult by their inclusion in the figure.

A memory block MBLK contains a not-illustrated memory cell array, a sense amplifier, and a precharge circuit.

The memory cell array has a plurality of word lines, a plurality of bit lines, and a plurality of memory cells, each of which is provided at the intersection between a word line and a bit line. Each memory cell is a dynamic memory cell comprising a MOS transistor and a capacitor. The memory array is, for example, a generally-known two-intersection-type memory array. Therefore, in the case of a plurality of bit lines, two adjacent lines are paired and used as complementary bit lines, and each memory cell is electrically connected to one of the two intersections of a word line and complementary bit lines.

The sense amplifier comprises a plurality of unit sense amplifiers provided one-to-one for corresponding complementary bit lines and their operation control switches. Each unit sense amplifier comprises a pair of n-channel MOS transistors, each of whose gate and drain are cross-connected to each other and whose drain is connected to a corresponding complementary bit line, and a pair of p-channel MOS transistors, each of whose gate and drain are also cross-connected to each other and whose drain is also connected to a corresponding complementary bit line. The sources of the n-channel MOS transistors of a plurality of unit sense amplifiers are connected to a first common source line, and the sources of the p-channel MOS transistors of a plurality of unit sense amplifiers are connected to a second common source line. The operation switch comprises a power switch including an n-channel MOS transistor for supplying a low potential such as the ground potential of the circuit to the first common source line, and a power switch including a p-channel MOS transistor for supplying power to the second common source line.

The precharge circuit comprises, e.g., a plurality of precharge switches, each including an n-channel MOS transistor provided between complementary bit lines so as to set a complementary bit line to the potential between high and low levels by short-circuiting the high potential and low potential supplied to the complementary bit line according to the operation of a sense amplifier. The precharge circuit can be further provided with a common source line precharge switch for short-circuiting the first and second common source lines after the power switches of the first and second common source lines are both turned off and setting the first and second common source lines to a half-level precharge level, or a half-level-voltage generation circuit and a switch for preventing the precharge of a complementary line from changing due to an undesired leakage current component.

A peripheral circuit PHC comprises various circuits such as a row address decoder (or X-decoder) circuit for decoding a row address signal supplied through an input/output interface circuit (or I/O circuit) I/O, a word driver circuit for generating a word line selection signal by receiving a signal decoded by the row address decoder circuit and an adequate word-line selection timing signal, a column address decoder (or Y-decoder) circuit for decoding a column address signal supplied through the input/output interface circuit I/O, a column switch circuit for selecting a complementary bit line of a memory array in accordance with the output of the column address decoder circuit and connecting the line with a common complementary bit line, a precharge circuit for the common complementary bit line, a main amplifier for receiving a read data signal through the common complementary bit line, a data write circuit for generating a write data signal supplied to the common complementary bit line, a refresh control circuit including a refresh address counter for refreshing the data in each memory cell of the memory array, and a timing control circuit for generating various timing signals and control signals for controlling the operations of the above circuits in accordance with control signals supplied through the input/output interface circuit I/O, and timing signals and control signals for controlling the operation of voltage converter circuits VDHG1 and VDHG2.

In the peripheral circuit PHC, each of the above circuits except the column switch circuit is constituted by a CMOS circuit comprising a p-channel MOS transistor and an n-channel MOS transistor. In the peripheral circuit PHC, most CMOS circuits except the word driver circuit operate by receiving a voltage VCL supplied from the voltage converter circuit VDHG1 as their power supply voltage. Circuits such as the word driver circuit for generating a selection signal of a relatively high level are operated by a power supply voltage at a relatively high level such as the external power-supply voltage VDD.

The input/output interface circuit I/O includes a plurality of input buffering circuits for receiving control signals such as an external row address strobe signal /RAS, column address strobe signal /CAS, output enable signal /OE, and write enable signal, and an external address signal and data signal. The input/output interface circuit also includes a plurality of data output buffering circuits for generating data signals DQ0 to DQN to be output to the outside. The above circuits of the input/output interface circuit I/O each comprise a CMOS circuit and are operated by the power supply voltage VDD.

This embodiment is provided with two voltage converter circuits, such as a voltage converter circuit VDHG1 for supplying the converted voltage VCL to the peripheral circuit PHC and a voltage converter circuit VDHG2 for supplying the converted voltage VDL to the memory block MBLK.

These two voltage converter circuits are used for the following reason.

The peripheral circuit PHC includes the various circuits described above, and controls the reading and writing of signals from and into a memory cell. A recent Mbit-class DRAM tends to decrease the split number of bit lines in order to reduce chip size, or to increase the number of memory arrays to be simultaneously activated in order to keep the same memory cell refresh time, despite the increased memory capacity. Moreover, a data input/output pin tends to have multiple bits, such as 8, 16, or 32 bits, in order to adapt a DRAM to a small-scale system such as a portable information terminal, amusement computer, or personal computer. Accordingly, the peak current of the power supply for circuit operation increases, the driving capacity of the voltage converter circuit is lowered due to a temporary voltage drop of the power supply line VDD even if the power supply voltage is high, and therefore the possibility arises that the internal system of the peripheral circuit PHC erroneously operates.

However, this embodiment makes it possible to keep a high driving capacity under not only a low power supply voltage but also under the above conditions, because the output section of the differential amplifier has a push-pull structure. Moreover, in the case of a DRAM, current hardly flows in the standby state, but current with the above large peak flows in the active state. Therefore, the gate voltage of the driving transistor must swing up to the VDD in the standby state because current is completely cut off, and up to the VSS in the active state in order that a large current may be made to flow.

Also, the voltage converter circuit of this embodiment is most suitable. In the case of this embodiment, the voltage converter circuit is dividedly provided to the peripheral circuit (over power supply line VCL) and the memory cell array (over power supply line VDL). The reason is as follows. In the peripheral circuit and memory cell array, almost equal average currents flow. The former has the feature that the peak value of current is relatively small and its width is also small but current flows at almost all cycles. However, the latter has the feature that the peak value and its width are large but current flows only for some of the operation cycles. In this case, when current is supplied by the same voltage converter circuit, a large voltage drop occurs if the sense amplifier operates and obstructs the operation of the peripheral circuit under operation.

Moreover, the peripheral circuit and the memory cell array are different from each other in optimum operating voltage. That is, it is required to set a voltage as high as possible for the peripheral circuit in order to operate the circuit at high speed, but to set a slightly low voltage for the memory cell array in order to ensure the withstand voltages of the elements and to reduce power consumption. Therefore, by using two voltage levels, it is possible to satisfy both requirements.

As described above, because this embodiment makes it possible to change the gate voltage of the driving transistor from VDD to VSS at a high speed, it is possible to stably operate the memory. In this case, a DRAM has been described as an example of the memory, but this embodiment can be applied to any CMOS memory with a sharp fluctuation of load current, or to a logic circuit.

Each of the voltage converter circuits VDHG1 and VDHG2, though not so restricted, comprises a voltage converter circuit having a relatively low driving capacity and performing a steady operation, and a voltage converter circuit having a relatively high driving capacity and performing an intermittent operation. Though the steady voltage converter circuit and the intermittent voltage converter circuit have the basic structure shown in FIG. 1, they have the following differences.

That is, in the case of the steady voltage converter circuit, the gate is kept at a fixed potential such as the reference potential VLH or the power supply voltage VDD, so that a current source transistor corresponding to the current source transistor Q9 in FIG. 1 may perform the steady operation. Transistors such as the control transistors Q11 and Q12 of FIG. 1 are omitted. Moreover, the steady voltage converter circuit is constituted so that a driving transistor corresponding to the driving transistor Q10 of FIG. 1 has a relatively small gate, its conductance constant b is made relatively small, and the transistor corresponding to the current source transistor Q9 of FIG. 1 has a relatively small conductance constant b in order to decrease the power consumption of the transistor.

In the case of the intermittent voltage converter circuit, the driving transistor is increased in size so as to have a relatively high driving capacity and a relatively large conductance constant b, and the operating current at the differential input stage is also made relatively large so that the large driving transistor can be driven at a sufficiently high speed.

The operation of the intermittent voltage converter circuits are controlled by the control signals F1, F2, and F3 output from the control circuit CNT. The control circuit CNT generates the control signals F1 to F3 in response to a memory selection signal such as the external row address strobe signal /RAS supplied through the input/output interface circuit I/O and the peripheral circuit PHC and the refresh control signal supplied from the previously-described refresh control circuit in the peripheral circuit PHC. Therefore, when /RAS is set to the low-level enable level, the control signals F1 to F3 are set to high level in response to the enable level of /RAS so as to bring the intermittent voltage converter circuit into operation. Moreover, when the refresh signal is output, the control signals F1 to F3 are set to low level for the refreshing period.

Figure 7:
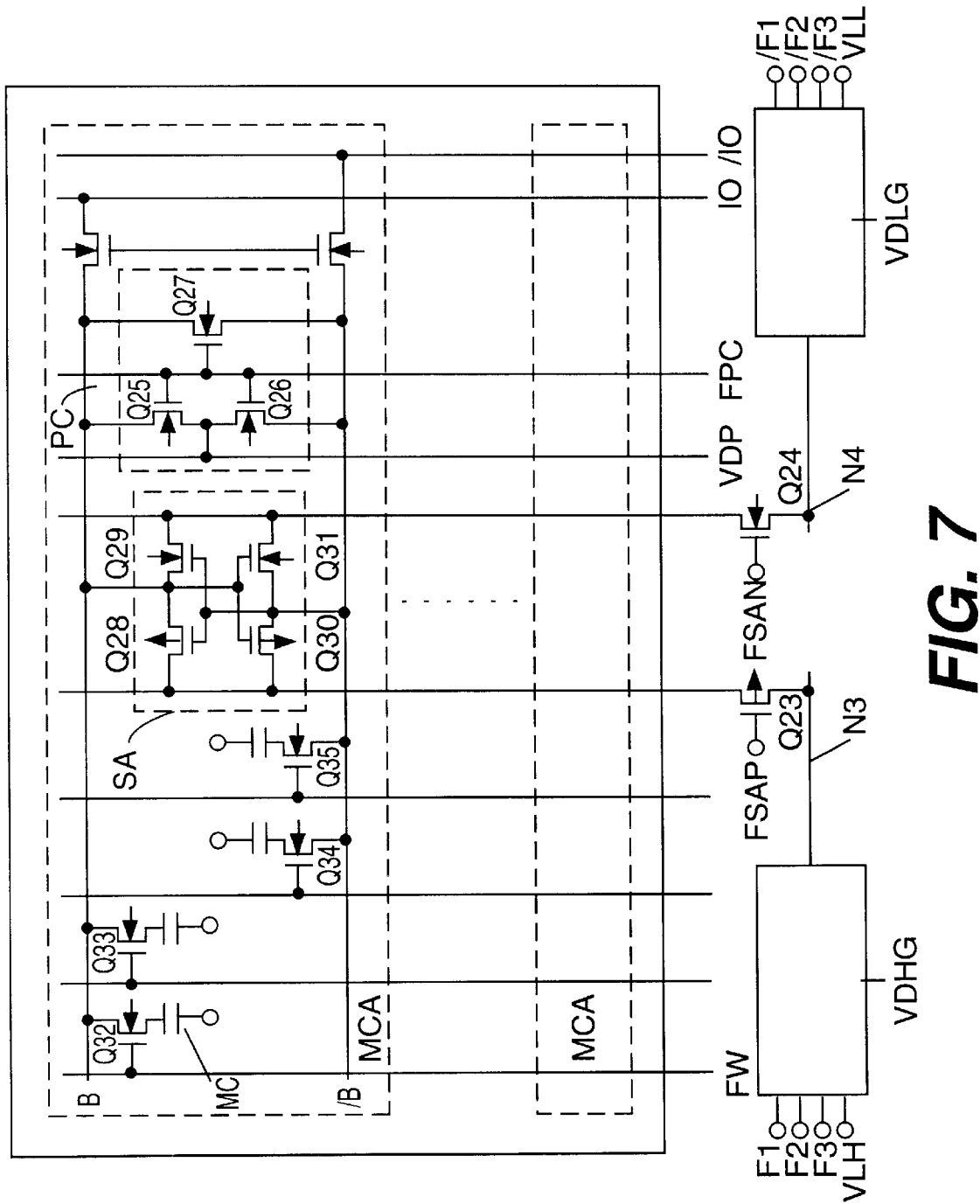
FIG. 7 is an example to which the first and second embodiments of the present invention are applied.
Figure 8:
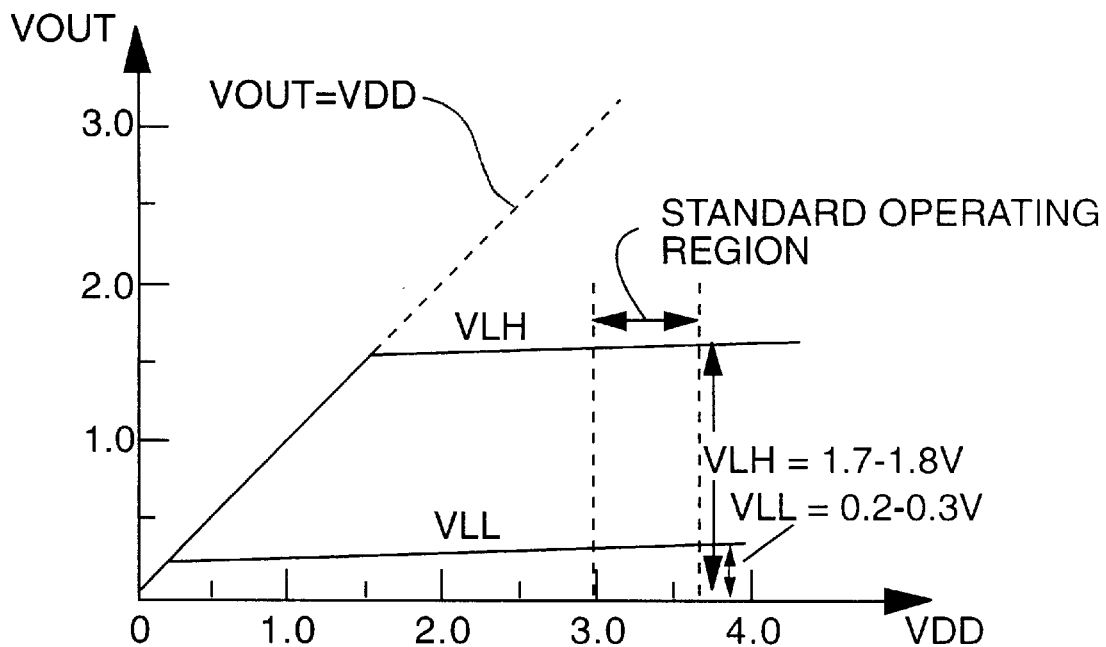
FIG. 8 shows the dependence of the reference voltage of the embodiment shown in FIG. 7 on the power supply voltage.

FIG. 7 shows a case in which the voltage converter circuits of FIGS. 1 and 5 are applied to the circuit of the memory cell array portion of a DRAM. This embodiment is characterized in that the voltage converter circuits VDHG (such as the one shown in FIG. 1) and VDLG (such as the one shown in FIG. 5) are provided in order to make the voltage of the common driving line on the p-MOS side of the sense amplifier lower than VDD, and the voltage of the common driving line on the n-MOS side of the amplifier higher than VSS, respectively. FIG. 8 shows the dependence of the reference voltage input to VDHG and VDLG on the power supply voltage.

A method of making the voltage of the common driving line on the p-MOS side of the sense amplifier lower than VDD and the voltage of the common driving line on the n-MOS side of the amplifier higher than VSS is described in, for example, *IEEE JOURNAL OF SOLID-STATE CIRCUITS*, Vol. 30, No. 4 (April 1995), pp. 471–479. In the case of this method, the voltage of the common driving line on the n-MOS side is very close to VSS. Therefore, the driving capacity of a voltage converter circuit for supplying current to the driving line on the n-MOS side becomes insufficient. Thus, the above paper describes a so-called over-driving method of temporarily bypassing the current of the common driving line on the n-MOS side to VSS and then making the current slowly reach a specified level by the current supplied from the voltage converter circuit. However, because the present application example uses the voltage converter circuit shown in FIG. 5, a high driving capacity is obtained, so that it is unnecessary to bypass current. Therefore, the sense amplifier driving circuit can be simplified.

Moreover, it is possible to avoid the problem that the voltage of the internal power-supply node N4 is excessively lowered due to excessive over-driving, VT of the memory cell transistors is lowered, and the information holding time is shortened. For the voltage of the common driving line on the p-MOS side, the driving capacity does not become insufficient as long as the characteristic shown in FIG. 8 is kept in the standard operating region. However, when the operation is performed at a lower power supply voltage or the internal voltage is raised due to an increase in the number of signals, the above problem occurs. Therefore, this embodiment uses the voltage converter circuit shown in FIG. 1 so that it operates with a margin even under the above condition.

As described above, in this embodiment, it is possible to simplify the driving circuit of the sense amplifier because a high driving capacity is obtained even if the power supply voltage and the internal voltage of the driving transistor are close to each other, whereby a stable operation of the sense amplifier can be realized.

Figure 9:
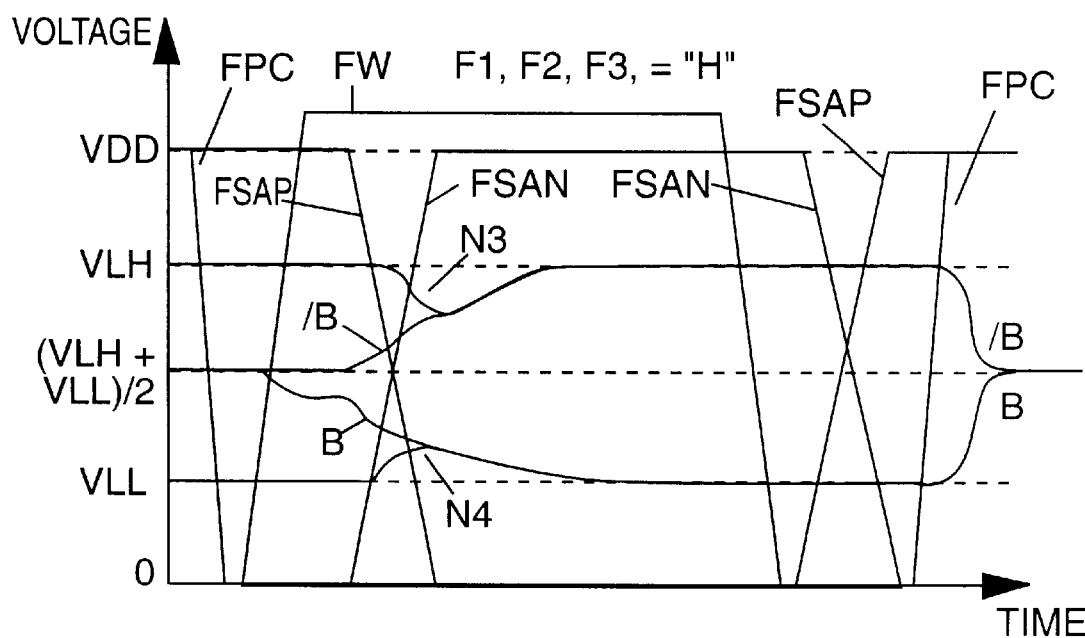
FIG. 9 shows the operating waveforms of an example to which the first and second embodiments are applied.

FIG. 9 shows operating waveforms for the embodiment of FIG. 7. In this case, symbols B and /B denote bit lines, FPC denotes a bit-line precharge signal, FW denotes a word-line driving signal, and FSAP and FSAN denote driving signals for p-MOS and n-MOS sense amplifiers, respectively. These operating waveforms show the state of access to a memory cell in which a signal is read from the memory cell when a word line is set from VSS to Vpp and thereafter amplified to VLL or VLH by a sense amplifier. In the case of the DRAM of this embodiment, reference potential VSS (which is normally the ground potential, i.e., 0 V), low potential VLL and high potential VLH when amplifying a signal sent from a memory cell and appearing on a data line, data-line precharge potential Vpc (=(VLH+VLL)/2), and potential Vpp when selecting a word line, are prepared as the substrate bias potentials VBB and power supply potentials used inside. VSS and VDD are supplied from the outside of the device as externally-supplied power, and the internal potentials VBB, VLL, Vpc, VLH, and Vpp are generated from the externally-fed power. Moreover, these potentials meet the inequality VBB<VSS<VLL<Vpc<VLH<VDD<Vpp.

In the case of a DRAM design in which the low-potential VLL is equal to VSS, VDLG can be omitted.

Symbols F1, F2, F3, F1, /F2, and /F3 denote signals for stopping or operating the voltage converter circuit. These signals are able to stop the function of the voltage converter circuit by setting F1, F2, and F3 to low level and /F1, /F2, and /F3 to high level when the chip is brought into a standby state. Furthermore, by adopting the above-described over-driving method for this embodiment, a high-speed operation is realized even at a lower voltage.

[Embodiment 4]

As described above, in the case of a semiconductor integrated circuit such as a memory, the power consumption is further increased though the power supply voltage is lowered as the circuit is further miniaturized and its integration degree is further raised. Therefore, the semiconductor integrated circuit tends to erroneously operate due to the voltage drop attributed to the power supply wiring of the mounting circuit board and the inductance component of the package.

Figure 10:
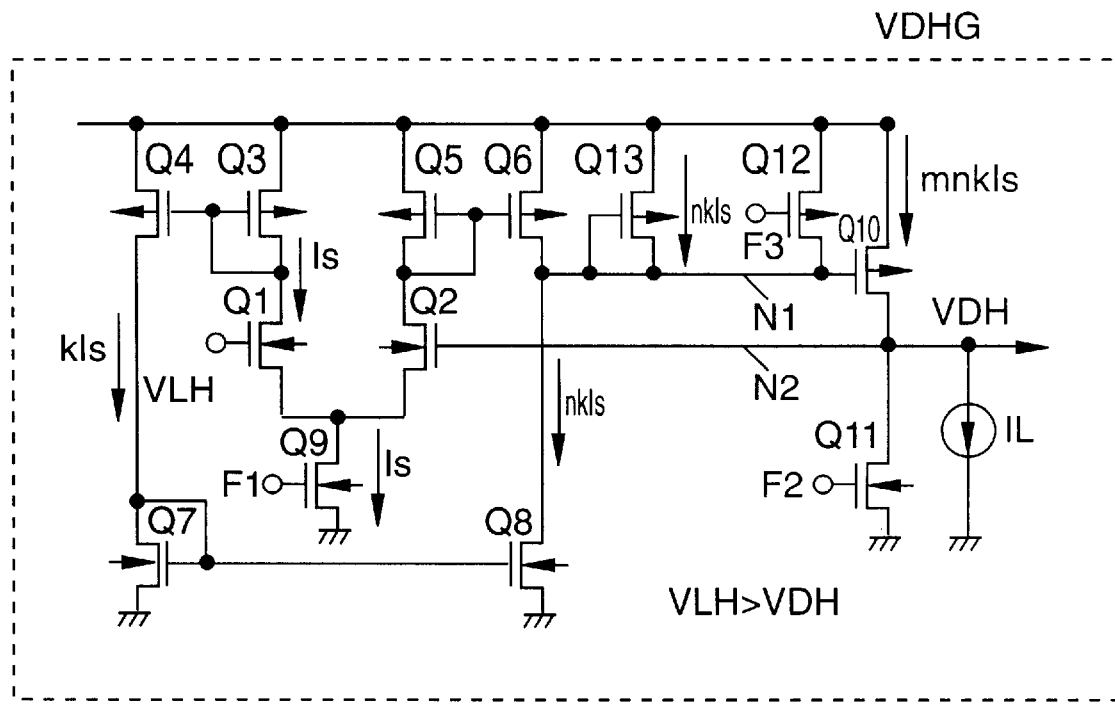
FIG. 10 shows a voltage converter circuit according to the fourth embodiment of the present invention.

FIG. 10 shows a fourth embodiment of the present invention. This embodiment is characterized in that a diode-connected transistor Q13 is provided between the gate and the source of the output transistor of the voltage converter circuit shown in FIG. 1, and the output transistor has a current limiting function.

In FIG. 10, Q9 operates as a constant-current source whose current value is represented by Is. When current flows through the load and VDH drops, the current of Q1 becomes Is and the current of Q2 becomes 0. Letting the mirror ratio between Q4 and Q3 be represented by k, a current of k·Is flows through Q4. Moreover, letting the mirror ratio between Q8 and Q7 be represented by n, the current flowing through Q8 becomes n·k·Is. The current of Q6 is zero because the currents of Q2 and Q5 are zero. Therefore, the current of Q8 flows through Q13.

In this case, because Q13 and the output transistor Q10 constitute a current mirror circuit, the current of Q10 is limited to m·n·k·Is, where m is the mirror ratio between Q13 and Q10. When the bias condition of Q10 is brought into an unsaturated region, the current of Q10 becomes smaller than the value of m·n·k·Is. Thus, it is possible to limit the current of the voltage converter circuit to an arbitrary value.

As described above, because this embodiment makes it possible to limit the current flowing through the driving transistor, it is possible to reduce the voltage drops of the power supply lines inside and outside the chip and stabilize the operation of other chips in addition to the on-chip circuit. Thus, the embodiment is suitable for the power supply of a sense amplifier circuit through which a particularly large peak current flows among memory circuits.

Figure 11:
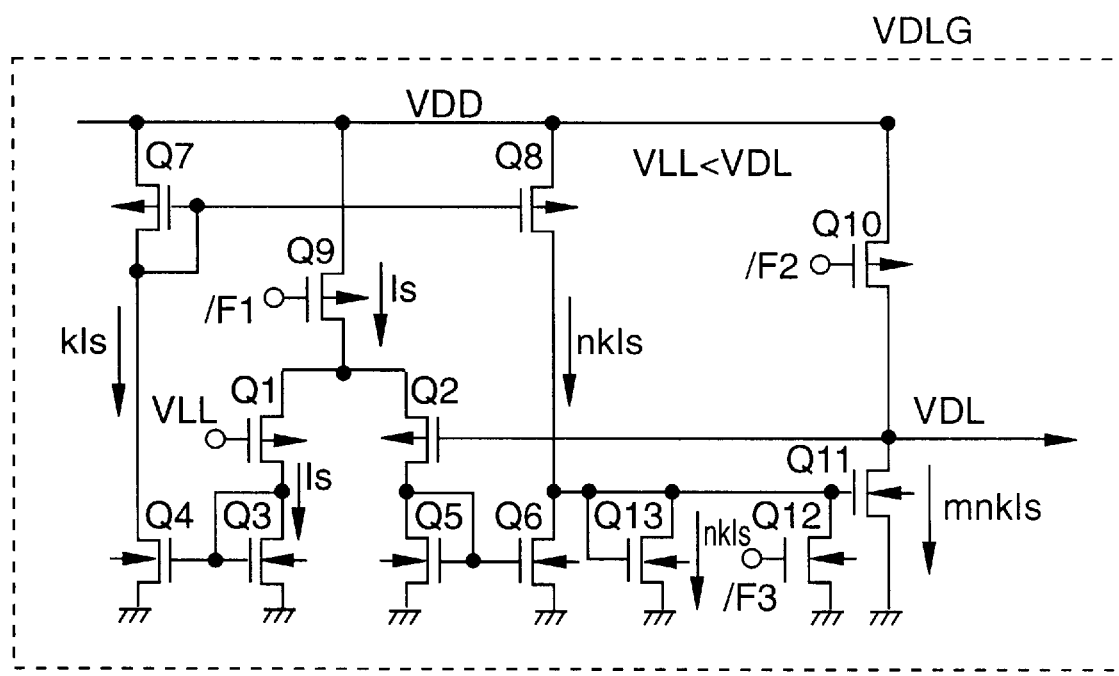
FIG. 11 shows another voltage converter circuit of the fourth embodiment of the present invention.

FIG. 11 shows a variation of the fourth embodiment of the present invention. This variation is characterized in that the diode-connected transistor Q13 is provided between the gate and the source of the output transistor of the voltage converter circuit shown in FIG. 5 and the output transistor has a current limiting function. The principle of operation and the advantages of this embodiment are the same as those of the embodiment shown in FIG. 10.

[Embodiment 5]

FIGS. 12–17 and 19 show a MOS transistor with a low threshold voltage and a voltage generator using an internal rise voltage Vpp or substrate voltage VDD as a fifth embodiment of the present invention. Moreover, FIG. 18 shows a modification of the transistor and the generator.

Figure 12:
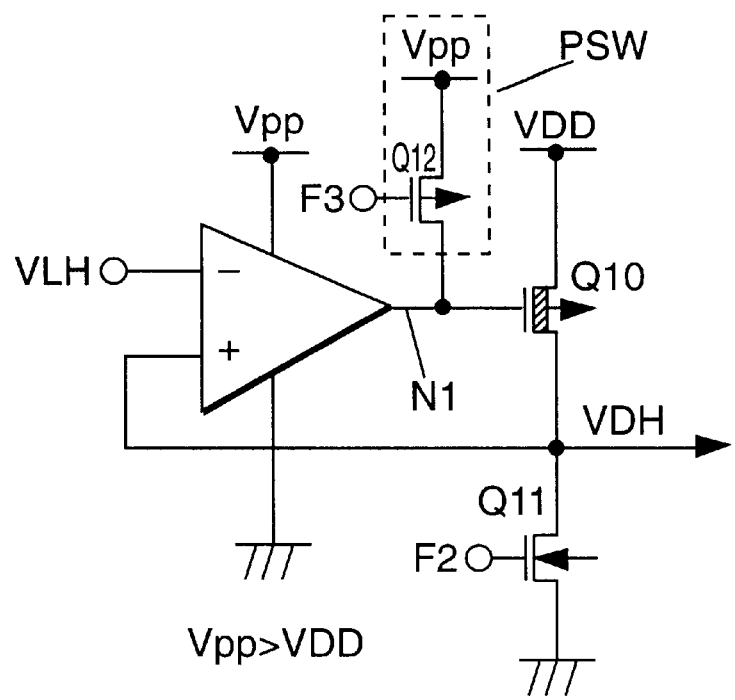
FIG. 12 is a conceptual view of a voltage converter circuit according to a fifth embodiment of the present invention.

FIG. 12 shows the concept of the embodiments of the present invention described below. These embodiments are characterized in that the absolute value of the threshold voltage of the driving transistor Q10 of the buffering circuit is made lower than the absolute values of the threshold voltages of other transistors, and the power supply voltage of the differential amplifier is set to a voltage Vpp that is higher than the source voltage VDD of Q10. The circuit symbol of Q10 is depicted differently to indicate that Q10 has a low threshold voltage in the FIG. 12 embodiment. By lowering the absolute value of the threshold voltage of Q10, the driving capacity of Q10 rises and Q10 operates at a lower power supply voltage.

In this case, the power supply voltage of the differential amplifier is set higher than the source voltage VDD of Q10 for the following reasons. When the absolute value of the threshold voltage is lowered, the sub-threshold current of the transistor increases (approximately ten times for 0.1 V) and current flows through the channel of Q10 from VDD even if the voltage between the gate and source is 0 V, causing the output voltage of the voltage converter circuit to rise up to a value higher than a predetermined value. When the output voltage becomes higher than the predetermined value, racing occurs between a circuit operating at the external voltage VDD and a circuit operating at the internal voltage VDH, and the circuits erroneously operate.

Moreover, when the output voltage exceeds the withstand voltages of the transistors, the reliabilities of the transistors are sharply lowered. To prevent this problem, it is necessary to set the voltage between the gate and source of Q10 to a value higher than 0 V. When making the power supply voltage of the differential amplifier higher than VDD, the output voltage of the differential amplifier rises up to Vpp unless any load current flows. Therefore, it is possible to make the voltage between the gate and source of Q10 higher than 0 V. This is the reason why the differential amplifier is operated at a voltage higher than VDD.

In this case, though Q12 is connected to the gate of Q10 in order to completely cut off the current of Q10 when no load current flows, it is also necessary to set the source voltage of Q12 to Vpp. Moreover, it is necessary to set the high level of F3, which serves as a control signal for Q12, to Vpp. Furthermore, even if the threshold voltage of Q10 is set to a positive value, that is, depleted, it is possible to set the leakage current to a conventional level. Therefore, it is possible to further raise the driving capacity.

As described above, this embodiment realizes a voltage converter circuit with a high driving capacity and a high stability even at a low power supply voltage.

Figure 13:
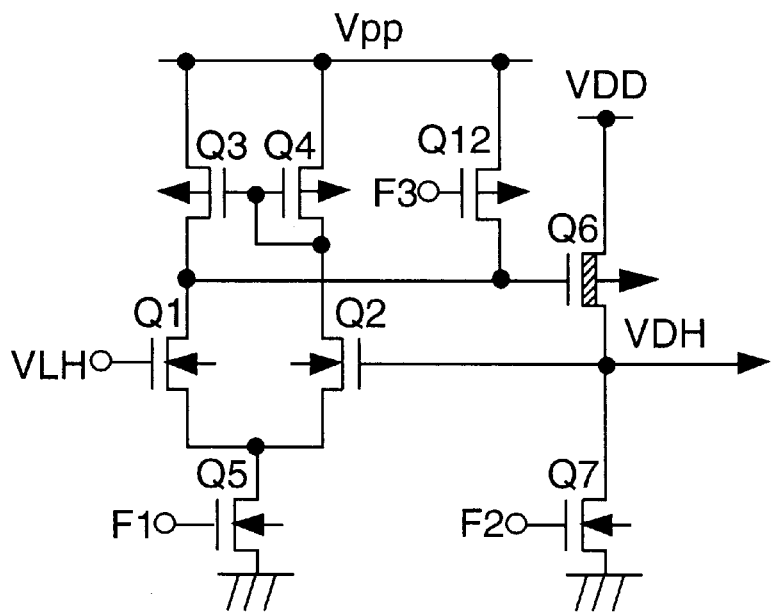
FIG. 13 shows one of the voltage converter circuits of the fifth embodiment of the present invention.

FIG. 13 is a preferred embodiment implementing the concept of FIG. 12. In this case, the differential amplifier is conventional. Therefore, though the gate voltage of Q6 does not drop to VSS as described above, the driving capacity is raised correspondingly to the reduction of the absolute value of the threshold voltage of Q10.

Figure 14:
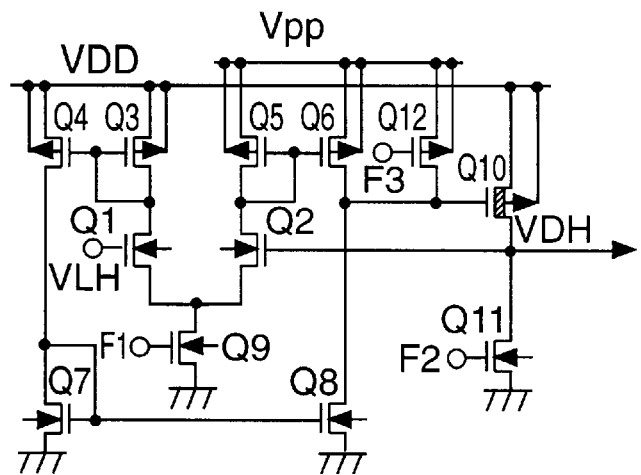
FIG. 14 shows a converter circuit of the fifth embodiment of the present invention.

FIG. 14 is another embodiment of VDHG of the present invention. This embodiment is characterized in that the absolute value of the threshold voltage of the driving transistor Q10 of the buffering circuit shown in the first embodiment is made lower than those of the other transistors, and, moreover, a part of the differential amplifier circuit connected to Q10 is operated at Vpp, which is higher than VDD. Thereby, it is possible to raise the driving capacity of the driving transistor Q10 while keeping the feature that the output voltage of the differential amplifier can be set to VSS. Thus, it is possible to realize a driving capacity that is higher than that of the fourth embodiment.

In this case, the source voltages of Q3 and Q4 of the differential amplifier are set to VDD and the source voltages of Q5 and Q6 are set to Vpp in order to minimize the power consumption because, when generating Vpp by a bottom-up charge pump on the chip, the conversion rate is too low. When supplying Vpp from the outside, or when there is enough margin in the power consumption of the whole chip, it is possible to connect any source voltage to Vpp.

Figure 15:
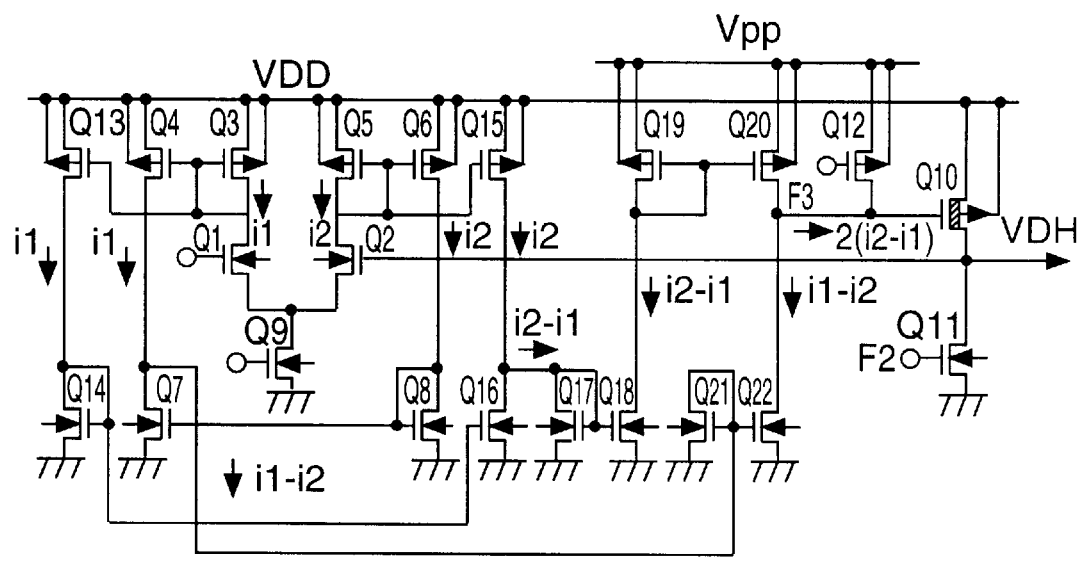
FIG. 15 shows one of the voltage converter circuits of the fifth embodiment of the present invention.

FIG. 15 is another embodiment of VDHG of the present invention. This embodiment is characterized in that the absolute value of the threshold voltage of the driving transistor Q10 of the buffering circuit is made lower than that of other transistors, and moreover a circuit operating at the power supply voltage Vpp and supplying a current proportional to the difference between the currents flowing through the differential amplifier transistors Q1 and Q2 is provided between the differential amplifier and Q10, and the driving transistor Q10 is driven by the output of the circuit. Thereby, because current flows through the driving circuit Q10 only when its output voltage VDH fluctuates, it is possible to greatly reduce the current flowing through Vpp. Moreover, because the output section of the driving circuit has a push-pull structure and its output voltage thereby changes up to VSS similarly to the second and fourth embodiments, it is possible to obtain a high driving capacity. The operation of the circuit will be described below.

First, let the currents flowing through the transistors Q1 and Q2 of the differential amplifier be represented by i1 and i2, respectively. The transistors Q5, Q6, and Q15, and Q3, Q4, and Q13, constitute p-MOS current mirror circuits. Moreover, the pair of transistors Q7 and Q8, and the pair of transistors Q14 and Q16, constitute n-MOS current mirror circuits.

In this case, assuming that the mirror ratios of the current mirror circuits are 1 for simple explanation, consider the currents flowing through Q17 and Q21. First, the current i1 flows through Q4 and the current i2 flows through Q7. Therefore, the difference i1−i2 flows through Q21. Moreover, the current i1 flows through Q16 and the current i2 flows through Q15. Therefore, the difference ib−i1 flows through Q17. In this case, because Q17 and Q18, Q21 and Q22, and Q19 and Q20 also respectively constitute current mirror circuits, the current ib−i1 flows through Q19 and Q20 and the current i1−i2 flows through Q22. Therefore, the gate of Q10 is charged or discharged with a current 2·(ib−i1). This means that current flows through Vpp only when the reference voltage is different from the output voltage of the voltage converter circuit, that is, only when i1≠i2. As described above, because this embodiment makes it possible to greatly reduce the power consumption of Vpp while keeping the load driving capacity almost equal to that of the fourth embodiment, this is particularly effective in mounting a Vpp-generation circuit on a chip.

Figure 16:
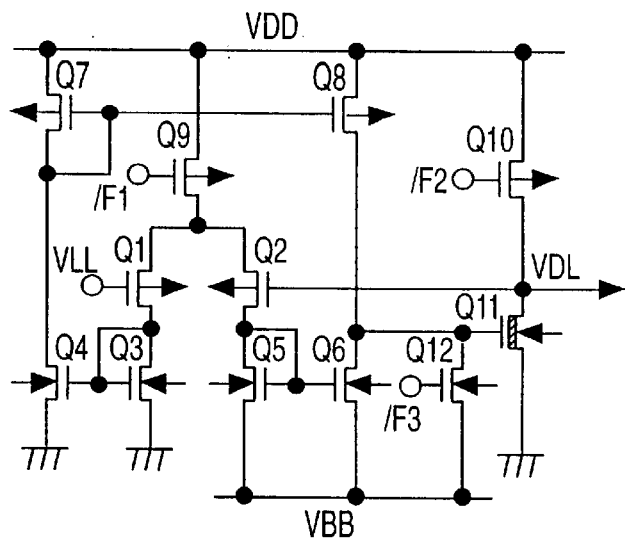
FIG. 16 is an illustration showing one of the voltage converter circuits of the fifth embodiment of the present invention.

FIG. 16 shows still another embodiment of VDLG according to the present invention. This embodiment is obtained by modifying the differential amplifier of the embodiment of FIG. 14 to a p-MOS-input type and the buffering circuit of the embodiment to a current-absorbing type. In this case, VBB is set to a voltage lower than VSS in order to completely cut off Q11 with a threshold voltage lower than those of the other transistors. The absolute value of the threshold voltage VT of Q11 is smaller than that of the other transistors. In the case of this circuit, though the polarity and bias voltage of each transistor are opposite to those of the embodiment in FIG. 14, the operation is completely the same as that of the embodiment of FIG. 14. By using the above structure, it is possible to further raise the current driving capacity compared to the second embodiment shown in FIG. 5.

Figure 17:
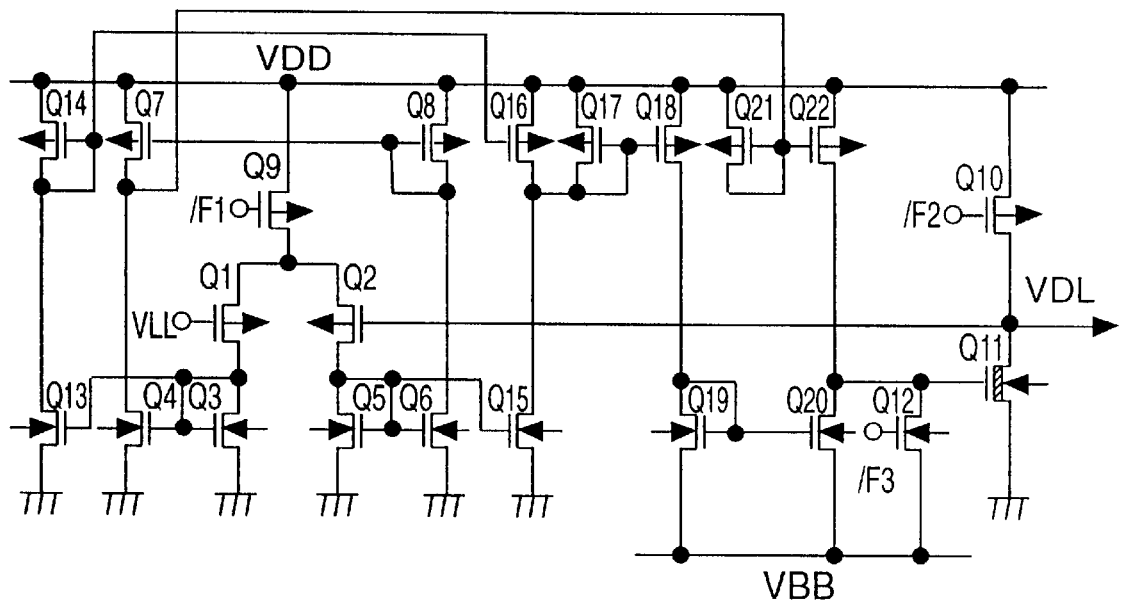
FIG. 17 shows one of the voltage converter circuits of the fifth embodiment of the present invention.
Figure 18:
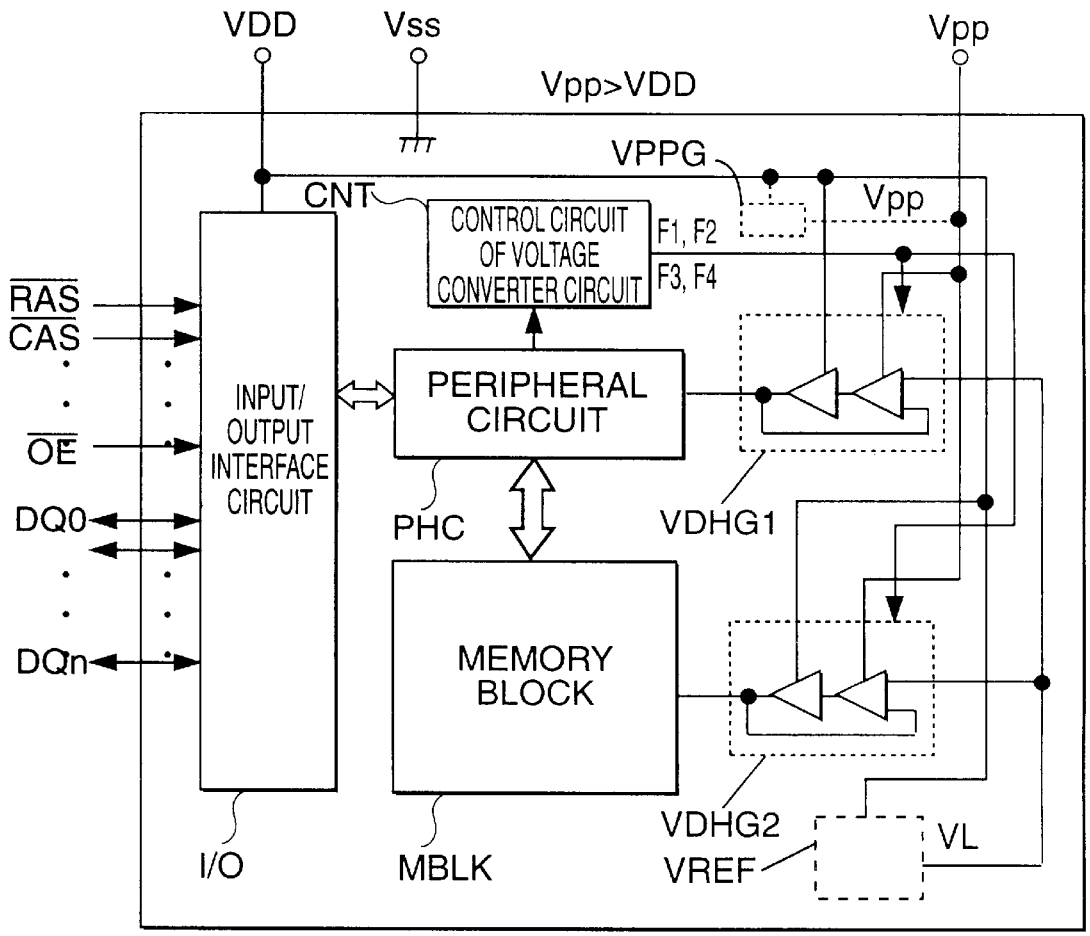
FIG. 18 shows the internal structure of a memory chip to which the fifth embodiment of the present invention is applied.

FIG. 17 shows still another embodiment of VDLG according to the present invention. This embodiment is obtained by modifying the differential amplifier of the embodiment of FIG. 15 to a p-MOS-input type and the buffering circuit of the embodiment to a current-absorbing type. The absolute value of the threshold voltage VT of Q11 is smaller than that of the other transistors. In the case of this circuit, though the polarity and bias voltage of each transistor are opposite to the those of the embodiment in FIG. 15, the operation is completely the same as that of the embodiment of FIG. 15. By using the above structure, it is possible to greatly decrease the current flowing through VBB while keeping the same current driving capacity as that of the embodiment of FIG. 15.

FIG. 18 is a concrete example applied to the memories of the embodiments in FIGS. 12–17. In this case, portions to which the voltage converter circuit are applied are the same as those of FIG. 6. Moreover, in this case, it is possible to supply Vpp from outside the chip, or to generate Vpp inside the chip by using the charge pump circuit. Though it is assumed to use Vpp in the above case, it is also possible to use VBB with the embodiment of FIG. 16 or 17. Furthermore, it is possible to supply VBB from outside the chip, or to generate it inside the chip by using the charge pump circuit.

When the memory and the microprocessor are further miniaturized and their integration degree is further improved, and when the device processing dimensions come to 0.1 mm or less in future, it is anticipated that the external voltage will be approximately 1.5 V and the operating voltage of the internal circuit will be lowered up to 0.8 to 1.5 V. To keep a high speed at these low voltages, it is necessary to change the transistors to the depletion type (that is, to set the threshold voltages to positive values for p-channel transistors and to negative values for n-channel transistors). An embodiment of a voltage converter circuit preferable for the above cases will be described below.

Figure 19:
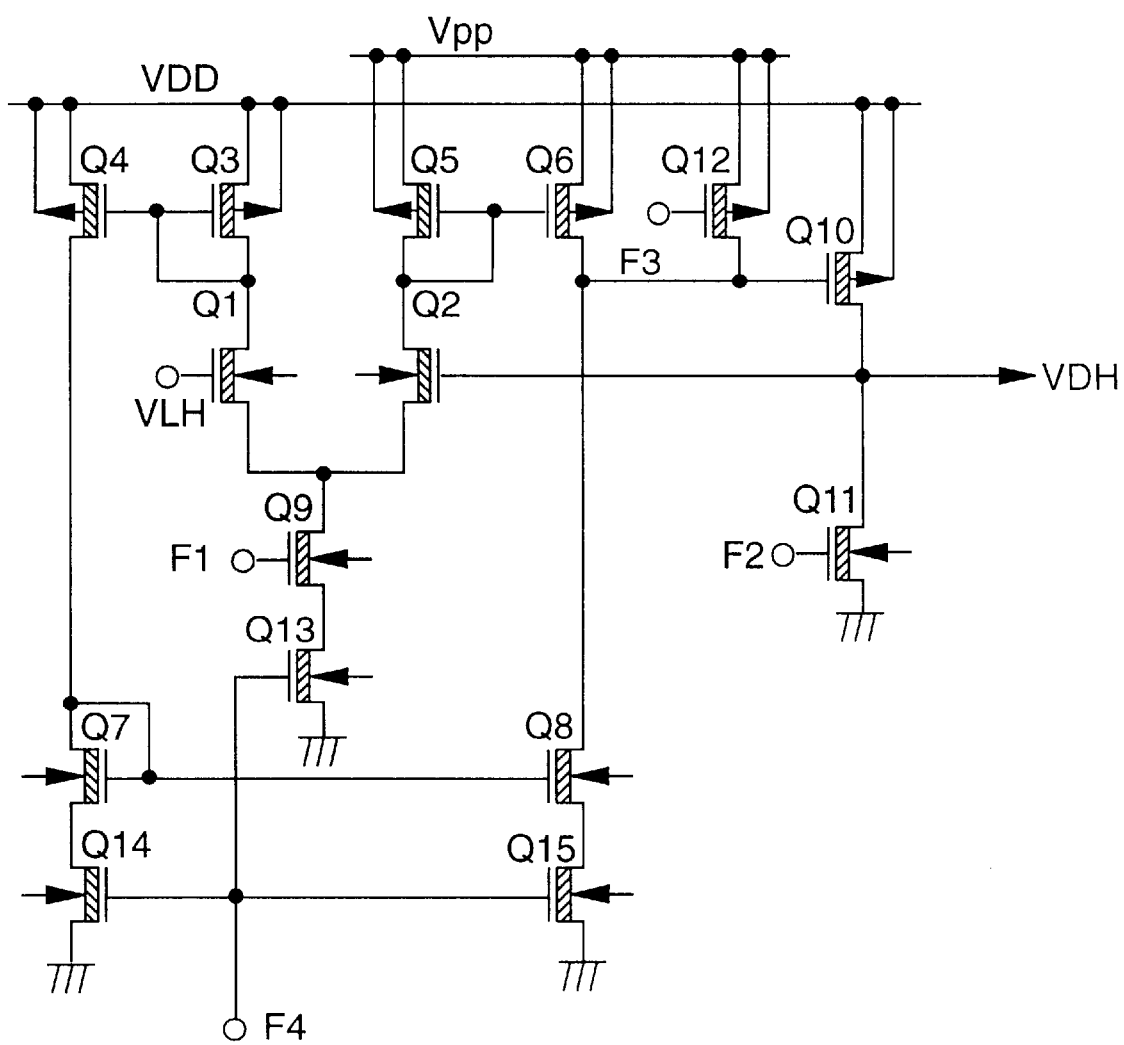
FIG. 19 shows one of the voltage converter circuits of the fifth embodiment of the present invention.

FIG. 19 shows still another embodiment of VDHG according to the present invention. This embodiment is characterized in that transistors Q13, Q14, and Q15 of the same channel conductivity type are provided on the source sides of the transistor Q9 of the differential amplifier and the transistors Q7 and Q8 of the current mirror circuit of the embodiment of FIG. 14, and thereby the current of the voltage converter circuit can be greatly reduced in the standby state and in the memory data holding mode. In FIG. 19, the transistors are depicted with a different symbol than those of the other figures, to denote that they are high-conductance (fully depleted) transistors.

Increase of leakage current due to the use of a depletion-type transistor occurs in the buffering circuit and in the differential amplifier. The increase of the leakage current can be avoided by further raising Vpp of FIG. 19 in the case of the buffering circuit. In the case of the differential amplifier and the current mirror circuit, however, the increase of the leakage current can be avoided by lowering the gate voltages of Q13, Q14, and Q15 to 0 V because, when lowering the gate voltages to 0 V, the voltage drop due to the gate voltages increases, the voltages between the sources of Q7, Q8, and Q9 and the substrate attain high negative values, and the threshold voltages of Q7, Q8, and Q9 rise. As described above, the embodiments of the present invention make it possible to decrease the leakage current even if depletion-type transistors are used and, therefore, it is possible to realize an increase in the operation speed of and a decrease in the power consumption of a gigabit-class, very-large-capacity memory with a processing dimension of 0.1 mm or less. The method used in this embodiment can be also applied to the embodiments of FIGS. 13, 15 to 17.

The first to fifth embodiments and their application examples have been described above. In these cases, one of two input terminals of the differential amplifier is directly connected to the output terminal of the voltage converter circuit. However, it is also possible to apply a voltage to the output terminal by dividing the voltage by means of resistors or transistors instead of directly inputting the voltage to the output terminal. In this case, a reference voltage input to the other input terminal must be a value multiplied by its voltage division ratio (described on p. 272 of *VLSI Memory*, noted above). That is, letting a desired output voltage be VCL, and assuming the resistance voltage ratio to be ½, it is necessary to set the reference voltage to VCL/2.

The above description is mainly made for application of a voltage converter circuit to a semiconductor memory generally mounted on a chip, particularly application of the voltage converter circuit to a DRAM. A voltage converter circuit of the present invention can be also applied to a general semiconductor device such as a microcomputer chip.

In the case of a semiconductor integrated circuit including a voltage converter circuit on a chip, the voltage converter circuit is constituted by a differential amplifier and a source-terminated buffering circuit including a driving transistor and a current source, wherein one input terminal of the differential amplifier is connected directly or through a voltage divider to the output terminal of the voltage converter circuit, the other terminal of the differential amplifier is connected to the output of a circuit for generating a voltage that is lower than the external power-supply voltage, and the same power supply voltage is applied to each circuit constituting the voltage converter circuit. The differential amplifier is constituted by a pair of diode-connected load transistors and an input transistor, a constant current source connected to the common source of the input transistor, first and second transistors constituting a current mirror circuit together with the paired load transistors, a third transistor which is of a conductivity type that is opposite to that of the first transistor and whose drain and gate are connected to the drain of the first transistor, and a fourth transistor which is of a conductivity type that is opposite to that of the second transistor, whose drain is connected to the drain of the second transistor and whose gate is connected to the gate of the third transistor. The drain of the second transistor is connected to the gate of the driving transistor of the buffering circuit. Thereby, because the gate voltage of the driving transistor changes from the ground level to the power supply voltage, it is possible to obtain a driving capacity higher than the conventional driving capacity.

In the case of the above voltage converter circuit, diode-connected transistors of the same conductivity type are set between the gate and the source of the driving transistor of the buffering circuit. Thereby, because the current flowing through the load can be limited to a certain value, it is possible to reduce the voltage drop of the power supply line outside or inside the chip and to stably operate the circuits inside the chip.

The threshold voltage of the driving transistor of the buffering circuit, when the driving transistor is of the p-channel type, is set higher than the threshold voltages of the transistors used in the other circuits in the chip. The power supply voltages of the differential amplifier and some or all of the current mirror circuits on the high-voltage side are set higher than the source voltage of the driving transistor of the buffering circuit. When the driving transistor is of the n-channel type, the threshold voltage of the driving transistor is set lower than the threshold voltages of the transistors used in the other circuit in the chip and the power-supply voltages of the differential amplifier and some or all of the current mirror circuits on the low-voltage side are set lower than the source voltage of the buffering circuit. Thereby, because the sub-threshold current can be reduced while raising the load driving capacity of the driving transistor, it is possible to realize stable operation of the internal circuits while maintaining a high-speed operation of the circuits.

In the case of the above voltage converter circuit, the following components are used: diode-connected first and second transistors serving as loads of the differential amplifier, third and fourth transistors constituting a current mirror circuit together with the first transistor, fifth and sixth transistors constituting a current mirror circuit together with the second transistor, a seventh transistor which is of a conductivity type opposite to that of the third transistor and whose drain and gate are connected to the drain of the third transistor, an eighth transistor which is of a conductivity type opposite to that of the third transistor and whose drain is connected to the drain of the third transistor, a ninth transistor which is of a conductivity type opposite to that of the fourth transistor and whose drain and gate are connected to the drain of the fourth transistor, a tenth transistor which is of a conductivity type opposite to that of the fifth transistor and whose drain and gate are connected to the drain of the fifth transistor, an eleventh transistor which is of a conductivity type opposite to that of the sixth transistor and whose drain and gate are connected to the drain of the sixth transistor, a twelfth transistor which is of a conductivity type opposite to that of the sixth transistor and whose drain is connected to the drain of the sixth transistor, a thirteenth transistor constituting a current mirror circuit together with the seventh transistor, a fourteenth transistor constituting a current mirror circuit together with the eleventh transistor, a fifteenth transistor which is of a conductivity type opposite to that of the thirteenth transistor and whose drain is connected to the drain of the thirteenth transistor, and a sixteenth transistor which is of a conductivity type opposite to that of the fourteenth transistor and whose drain and gate are connected to the drain of the fourteenth transistor.

The gate of the fifteenth transistor is connected to that of the sixteenth transistor, and the drain of the fifteenth transistor is connected to the gate of the driving transistor of the buffering circuit. The source potentials of the fifteenth and sixteenth transistors are set higher than the source potential of the driving transistor when the transistors are of the p-channel type, and lower than the source potential of the driving transistor when the transistors are of the n-channel type. Thereby, because the power consumption of the driving circuit of the driving transistor can be greatly reduced while keeping a high load driving capacity, it is possible to greatly decrease the area occupied by the circuit for generating a voltage higher than the above power supply voltage and a circuit for generating a voltage lower than the ground voltage on the chip.

In the case of the above voltage converter circuit, the differential amplifier comprises a pair of input transistors and an active load and a constant current source connected to the common source of the input transistors. The threshold voltage of the driving transistor of the buffering circuit, when the driving transistor is of the p-channel type, is set higher than the threshold voltages of the transistors used in the other circuits in the chip, the power supply voltage of the differential amplifier on the high voltage side is set higher than the source voltage of the driving transistor of the buffering circuit, and, when the driving transistor is of the n-channel type, the threshold voltage of the driving transistor is set lower than the threshold voltages of the transistors used in the other circuit in the chip, and the power supply voltage of the differential amplifier on the low voltage side is set lower than the source voltage of the buffering circuit. Thereby, the sub-threshold current can be reduced while raising the driving capacity of the driving transistor. Thus, it is possible to realize a stable operation of the internal circuits while maintaining a high-speed operation of the circuits.

In the case of the above voltage converter circuit, the threshold voltages of all transistors are set to 0 V or the transistors are modified to be depletion-type, transistors of the same channel conductivity type as that of the current source transistor—among the current source transistor connected to the common source of the paired input transistors of the differential amplifier, and the transistors constituting current mirror circuit for taking out the difference of the currents flowing through the paired input transistors—are connected in series to the common source of the pair of input transistors of the same conductivity type as that of the current source transistor of the differential amplifier, and the gate voltages of the transistors thus connected are made equal to the source voltages when the load circuit connected to the voltage converter circuit is not operated. Thereby, it is possible to greatly reduce the sub-threshold when in the standby state while maintaining high-speed operations, even at a low power supply voltage of approximately 1 V.

Any one of or a plurality of the above voltage converter circuits are applied to the memory cell array of a DRAM or its peripheral circuit. Thereby, because the driving capacities of the voltage converter circuits can be kept high even if the power supply voltage is low or the difference between the power supply voltage and internal voltage is small, it is possible to realize a large-capacity, high-speed, multiple-bit-structure, and a low-power-consumption memory.

Various modifications of the preferred embodiments of the invention described above will become apparent to the person of ordinary skill in the art upon reading this disclosure. All such modifications that basically rely on the teachings through which the invention has advanced the state of the art are properly considered within the spirit and scope of the invention.

We claim:

1. A semiconductor integrated circuit comprising a voltage converter and an internal circuit that receives an internal operating voltage output by the voltage converter, wherein the voltage converter includes:
    a power receiving node coupled to an external voltage;
    a first output node outputting said internal operating voltage, which has a smaller amplitude than that of the external voltage;
    a first transistor having a source coupled to the external voltage and a drain coupled to the first output node;
    a differential amplifier having:
        a first MOSFET and a second MOSFET whose sources are coupled;
        a first input node coupled to a reference voltage and being the gate of the first MOSFET;
        a second input node coupled to the first output node and being the gate of the second MOSFET;
        a second output node coupled to a first load and being the drain of the second MOSFET; and
        a third output node coupled to a second load and being the drain of the first MOSFET; and
    a push-pull circuit having:
        a second transistor whose gate is controlled in response to a first current flowing in the first load;
        a third transistor whose gate is controlled in response to a second current flowing in the second load; and
        a fourth output node coupled to an output of the second transistor, an output of the third transistor, and a gate of the first transistor.

2. A semiconductor integrated circuit according to claim 1,
    wherein said voltage converter further includes fourth and fifth transistors coupled in series to each other;
    wherein the second load and the fourth transistor are coupled together to make a first current mirror circuit;
    wherein the first load and the second transistor are coupled together to make a second current mirror circuit; and
    wherein the third transistor and the fifth transistor are coupled together to make a third current mirror circuit.

3. A semiconductor integrated circuit according to claim 2,
    wherein a current flowing in the source-drain path of the second transistor is proportional to the first current; and
    wherein a current flowing in the source-drain path of the third transistor is proportional to the second current.

4. A semiconductor integrated circuit according to claim 1,
    wherein said voltage converter further includes a diode coupled across the gate and source of the first transistor.

5. A semiconductor integrated circuit according to claim 1,
    wherein a threshold voltage of the first transistor is smaller than that of other transistors used in the differential amplifier and in the push-pull circuit; and
    wherein one end of the first load and a source of the second transistor are coupled to a first voltage that is greater than the external voltage.

6. A semiconductor integrated circuit according to claim 5,
    wherein one end of the second load is coupled to the external voltage.

7. A semiconductor integrated circuit according to claim 5, further comprising:
    a charge pump circuit receiving the external voltage and producing the first voltage.

8. A semiconductor integrated circuit according to claim 1,
    wherein an output signal amplitude of the push-pull circuit is larger than that of the differential amplifier.

9. A semiconductor integrated circuit according to claim 1,
    wherein said semiconductor integrated circuit is a dynamic random access memory, and said internal circuit includes a memory array having a plurality of memory cells and a plurality of sense amplifiers which are activated in response to a memory access of the plurality of memory cells;

wherein said voltage converter supplies the internal voltage to the plurality of sense amplifiers in response to the memory access.

10. A semiconductor integrated circuit comprising a voltage converter and an internal circuit that receives an internal operating voltage output by the voltage converter circuit, wherein the voltage converter includes:

a power receiving node coupled to an external voltage;

a first output node outputting said internal operating voltage, which has a smaller amplitude than that of the external voltage;

a first transistor having a source coupled to the external voltage and a drain coupled to the first output node;

a differential amplifier having:
- a first MOSFET and a second MOSFET whose sources are coupled;
- a first input node coupled to a reference voltage and being the gate of the first MOSFET;
- a second input node coupled to the first output node and being the gate of the second MOSFET;
- a second output node coupled to a first load and being the drain of the second MOSFET; and
- a third output node coupled to a second load and being the drain of the first MOSFET; and a push-pull circuit having:
- a second transistor whose gate is controlled in response to a first current which is proportional to a signed difference in current between a current flowing in the first load and a current flowing in the second load;
- a third transistor whose gate is controlled in response to a second current which is proportional to a signed difference in current between the current flowing in the second load and the current flowing in the first load; and
- a fourth output node coupled to an output of the second transistor, an output of the third transistor, and a gate of the first transistor;

wherein a threshold voltage of the first transistor is smaller than that of other transistors used in the differential amplifier and in the push-pull circuit; and wherein the source of the second transistor is coupled to a first voltage that is greater than the external voltage.

11. A semiconductor integrated circuit according to claim 10, wherein one end of one of the first and second loads is coupled to the external voltage.

12. A semiconductor integrated circuit according to claim 10, further comprising:

a charge pump circuit receiving the external voltage and producing the first voltage.

13. A semiconductor integrated circuit according to claim 10, wherein said semiconductor circuit is a dynamic random access memory, and said internal circuit includes a memory array having a plurality of memory cells and a plurality of sense amplifiers which are activated in response to a memory access of the plurality of memory cells, wherein said voltage converter supplies the internal voltage to the plurality of sense amplifiers in response to the memory access.

14. A semiconductor integrated circuit comprising a voltage converter and an internal circuit that receives an internal operating voltage output by the voltage converter circuit, wherein the voltage converter includes:

a power receiving node coupled to an external voltage;

a first output node outputting an internal voltage whose amplitude is smaller than the external voltage;

a transistor having a source coupled to the external voltage, and a drain coupled to the first output node; and a differential amplifier having:
- a first MOSFET and a second MOSFET whose sources are coupled;
- a first input node coupled to a reference voltage and being the gate of the first MOSFET;
- a second input node coupled to the first output node and being the gate of the second MOSFET;
- a second output node coupled to a first load and being the drain of the second MOSFET; and
- a third output node coupled to a second load and to the gate of the transistor and being the drain of the first MOSFET; and wherein a threshold voltage of the transistor is smaller than that of the first and second MOSFETs; and wherein one end of the first load and one end of the second load are coupled to a first voltage that is greater than the external voltage.

15. A semiconductor integrated circuit according to claim 14, further comprising:

a charge pump circuit receiving the external voltage and producing the first voltage.

16. A semiconductor integrated circuit according to claim 14, wherein said semiconductor circuit is a dynamic random access memory, and said internal circuit is a memory array including a plurality of memory cells and a plurality of sense amplifiers which are activated in response to a memory access of the plurality of memory cells, and wherein said voltage converter supplies the internal voltage in response to the memory access.

17. A semiconductor integrated circuit according to claim 1, wherein said first, second, and third transistors are depletion-type MOS transistors and the first and second MOSFETs are depletion-type MOS transistors.

18. A semiconductor integrated circuit according to claim 17, wherein one end of the first load and a source of the second transistor are coupled to a first voltage that is greater than the external voltage; and wherein one end of the second load is coupled to the external voltage.

19. A semiconductor integrated circuit according to claim 17, wherein the differential amplifier includes a first switch transistor in a current path of the differential amplifier;

wherein the push-pull circuit includes a second switch transistor in a current path of the push-pull circuit; and wherein the first and the second switch transistors are depletion-type MOS transistors.

20. A semiconductor integrated circuit comprising a voltage converter and an internal circuit that receives an internal operating voltage output by the voltage converter circuit, wherein the voltage converter includes:

a power receiving node coupled to an external voltage;

a first output node outputting said internal operating voltage, which has a smaller amplitude than that of the external voltage;

a first transistor having a source coupled to the external voltage and a drain coupled to the first output node;

a differential amplifier having:
  a first MOSFET and a second MOSFET whose sources are coupled;
  a first input node coupled to a reference voltage and being the gate of the first MOSFET;
  a second input node coupled to the first output node and being the gate of the second MOSFET;
  a second output node coupled to a first load and being a drain of the second MOSFET; and
  a third output node coupled to a second load and being a drain of the first MOSFET; and a push-pull circuit having:
  a second transistor whose gate is controlled in response to a first current which is proportional to a signed difference in current between the first load current and the second load current;
  a third transistor whose gate is controlled in response to a second current which is proportional to a signed difference in current between the second load current and the first load current; and
  a fourth output node coupled to an output of the second transistor, an output of the third transistor, and a gate of the first transistor;

wherein the source of the second transistor is coupled to a first voltage whose level is larger than the external voltage; and wherein said first, second, and third transistors are depletion-type MOS transistors and the first and second MOSFETs are depletion-type MOS transistors.

21. A semiconductor integrated circuit according to claim 20,
  wherein the differential amplifier includes a first switch transistor in a current path of the differential amplifier;
  wherein the push-pull circuit includes a second switch transistor in a current path of the push-pull circuit; and
  wherein the first and the second switch transistors are depletion-type MOS transistors.

22. A semiconductor integrated circuit comprising a voltage converter and an internal circuit that receives an internal operating voltage output by the voltage converter circuit, wherein the voltage converter includes:
  a power receiving node coupled to an external voltage;
  a first output node outputting an internal voltage whose amplitude is smaller than the external voltage;
  a transistor having a source coupled to the external voltage, and a drain coupled to the first output node; and
  a differential amplifier having:
    a first MOSFET and a second MOSFET whose sources are coupled;
    a first input node coupled to a reference voltage and being the gate of the first MOSFET;
    a second input node coupled to the first output node and being the gate of the second MOSFET;
    a second output node coupled to a first load and being the drain of the second MOSFET; and
    a third output node coupled to a second load and to the gate of the transistor and being the drain of the first MOSFET;
  wherein one end of the first load and one end of the second load are coupled to a first voltage that is greater than the external voltage; and
  wherein said transistor and the first and second MOSFETs are depletion-type MOS transistors.

23. A semiconductor integrated circuit according to claim 22,
  wherein the differential amplifier includes a first switch transistor in a current path of the differential amplifier; and
  wherein the first switch transistor is a depletion-type MOS transistor.

* * * * *